US010396190B2

(12) United States Patent
Ueda et al.

(10) Patent No.: US 10,396,190 B2
(45) Date of Patent: Aug. 27, 2019

(54) SEMICONDUCTOR DEVICE AND METHOD OF MANUFACTURING SEMICONDUCTOR DEVICE

(71) Applicant: RENESAS ELECTRONICS CORPORATION, Tokyo (JP)

(72) Inventors: Takehiro Ueda, Tokyo (JP); Yasuhiro Okamoto, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/985,987

(22) Filed: May 22, 2018

(65) Prior Publication Data

US 2019/0006500 A1    Jan. 3, 2019

(30) Foreign Application Priority Data

Jun. 28, 2017    (JP) .................................. 2017-125909

(51) Int. Cl.
*H01L 29/778*    (2006.01)
*H01L 21/265*    (2006.01)
*H01L 21/308*    (2006.01)
*H01L 29/66*    (2006.01)
*H01L 29/40*    (2006.01)
*H01L 29/423*    (2006.01)

(52) U.S. Cl.
CPC .... *H01L 29/7783* (2013.01); *H01L 21/26546* (2013.01); *H01L 21/308* (2013.01); *H01L 29/402* (2013.01); *H01L 29/42376* (2013.01); *H01L 29/66462* (2013.01); *H01L 29/7786* (2013.01)

(58) Field of Classification Search
CPC .......... H01L 29/7783; H01L 29/66462; H01L 21/26546; H01L 21/308
USPC .............. 257/76, 77, 20, 565, 338, 371, 347
See application file for complete search history.

(56) References Cited

U.S. PATENT DOCUMENTS

| 8,716,755 B2 | 5/2014 | Inoue et al. | |
| 2013/0069071 A1* | 3/2013 | Inoue .................... | H01L 29/205 257/76 |
| 2014/0264379 A1* | 9/2014 | Kub .................. | H01L 29/41725 257/77 |

(Continued)

FOREIGN PATENT DOCUMENTS

JP    2013-065649 A    4/2013

*Primary Examiner* — Bo Fan
(74) *Attorney, Agent, or Firm* — McDermott Will & Emery LLP

(57) ABSTRACT

Characteristics of a semiconductor device are improved. A semiconductor device includes a sequential stack of a buffer layer, a channel layer, and a barrier layer, and includes a mesa part including a fourth nitride semiconductor layer formed over the stack, and a side part formed on both sides of the mesa part and including a thin film part of the fourth nitride semiconductor layer. Generation of 2DEG is suppressed below the mesa part while being unsuppressed below the side part. In this way, the side part that disables the 2DEG suppression effect is provided on an end portion of the mesa part, thereby a distance from an end portion of the side part to the gate electrode is increased, making it possible to suppress leakage caused by a current path passing through an undesired channel formed between a gate insulating film and the mesa part.

19 Claims, 29 Drawing Sheets

(56) References Cited

U.S. PATENT DOCUMENTS

| | | | |
|---|---|---|---|
| 2015/0187599 A1* | 7/2015 | Ko | H01L 21/3212 438/492 |
| 2016/0049504 A1* | 2/2016 | Renaldo | H01L 29/7783 257/20 |
| 2016/0064539 A1* | 3/2016 | Lu | H01L 29/66462 257/76 |

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2017-125909 filed on Jun. 28, 2017 including the specification, drawings and abstract is incorporated herein by reference in its entirety.

BACKGROUND

The present invention relates to a semiconductor device and a method of manufacturing the semiconductor device. For example, the invention can be preferably applied to a semiconductor device using a nitride semiconductor.

GaN-based nitride semiconductor is expected to be used for a transistor in applications of high withstand voltage, high output, and high frequency because of its wide bandgap and high electron mobility compared with Si or GaAs, and has been actively developed in recent years. Among such transistors, a transistor having normally-off characteristics is useful, and a structure of the transistor is earnestly investigated so as to have the normally-off characteristics.

For example, Japanese Unexamined Patent Application Publication No. 2013-065649 discloses a transistor using a nitride semiconductor layer as a channel. In this transistor, two-dimensional electron gas (2DEG) is generated at an interface between a barrier layer and a channel layer. A mesa part is provided below a gate electrode to suppress generation of the 2DEG.

SUMMARY

The inventors have engaged in research and development of a semiconductor device using the nitride semiconductor, and have made earnest investigations on improvement in characteristics of the semiconductor device. Specifically, the inventors have made investigations on a structure (mesa-type MOS structure) of the transistor so that the transistor has the normally-off characteristics.

However, an increase in on resistance of the transistor has been found as described later. In particular, it has been found that if the thickness of the mesa part is increased to increase a threshold voltage, on resistance correspondingly increases.

Such a semiconductor device using the nitride semiconductor is desirably reduced in on resistance while maintaining the threshold voltage so as to have stable normally-off characteristics.

Other objects and novel features will be clarified from the description of this specification and the accompanying drawings.

Among the embodiments disclosed in this application, typical ones are briefly summarized as follows.

A semiconductor device of one embodiment disclosed in this application includes a sequential stack of a buffer layer including a first nitride semiconductor layer, a channel layer including a second nitride semiconductor layer, and a barrier layer including a third nitride semiconductor layer, and includes a mesa part (2DEG suppression layer) including a fourth semiconductor layer formed on the stack. In addition, the semiconductor device includes a side part formed on at least one side of the mesa part and including the fourth semiconductor layer. The side part extends to the outside of a gate electrode. Generation of the two-dimensional electron gas between the second and third nitride semiconductor layers is suppressed below the mesa part while being unsuppressed below the side part.

A method of manufacturing a semiconductor device according to one embodiment disclosed in this application includes the steps of: forming first to fourth nitride semiconductor layers in order; forming a mesa part including the fourth semiconductor layer, and forming a side part including the fourth semiconductor layer and provided on both sides of the mesa part, and forming a gate electrode above the mesa part. The side part extends to the outside of the gate electrode, and generation of two-dimensional electron gas between the second and third nitride semiconductor layers is suppressed below the mesa part while being unsuppressed below the side part.

According to the semiconductor device of each of the following typical embodiments disclosed in this application, characteristics of the semiconductor device can be improved.

According to the method of manufacturing the semiconductor device described in each of the following typical embodiments disclosed in this application, a semiconductor device having good characteristics can be manufactured.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements and others (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, a constitutional element (including an element step etc.) of the embodiment is not necessarily indispensable except for the particularly defined case and for the case where the constitutional element is considered to be indispensable in principle. Similarly, in the following embodiment, when a shape of a constitutional element, a positional relationship, and others are described, any configuration substantially closely related to or similar to such a shape or the like should be included except for the particularly defined case and for the case where such a configuration is considered to be not included in principle. The same holds true in each of the number of elements and others (including the number, a numerical value, amount, and a range).

Hereinafter, some embodiments will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a particular site. In the following embodiments, the same or similar portion is not repeatedly described in principle except for a particularly required case.

Furthermore, a sectional view for explaining each embodiment may not be hatched for better viewability. A plan view may be hatched for better viewability.

In the sectional views and the plan views, size of each site does not correspond to size of an actual device, and a particular site may be illustrated to be relatively large for better viewability. Even if a sectional view corresponds to a plan view, a particular site may be illustrated to be relatively large for better viewability.

First Embodiment

A semiconductor device of a first embodiment is now described in detail with reference to the accompanying drawings.

Description of Structure

Figure 1:
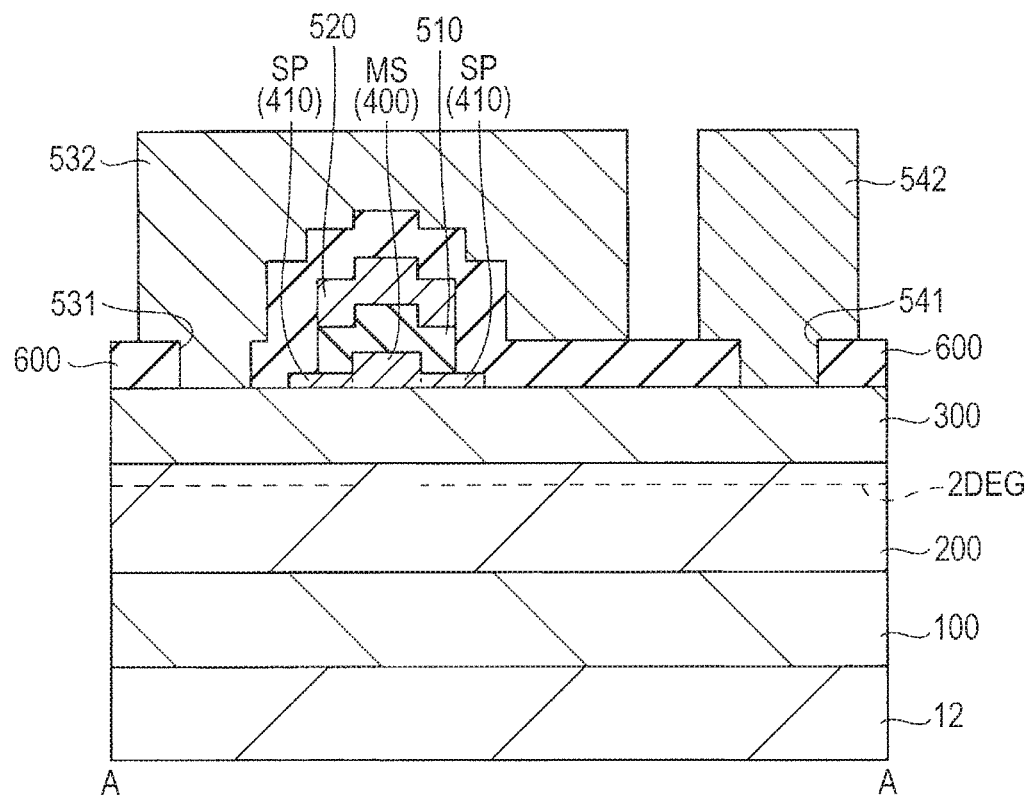
FIG. 1 is a sectional view illustrating a configuration of a semiconductor device of a first embodiment.
Figure 2:
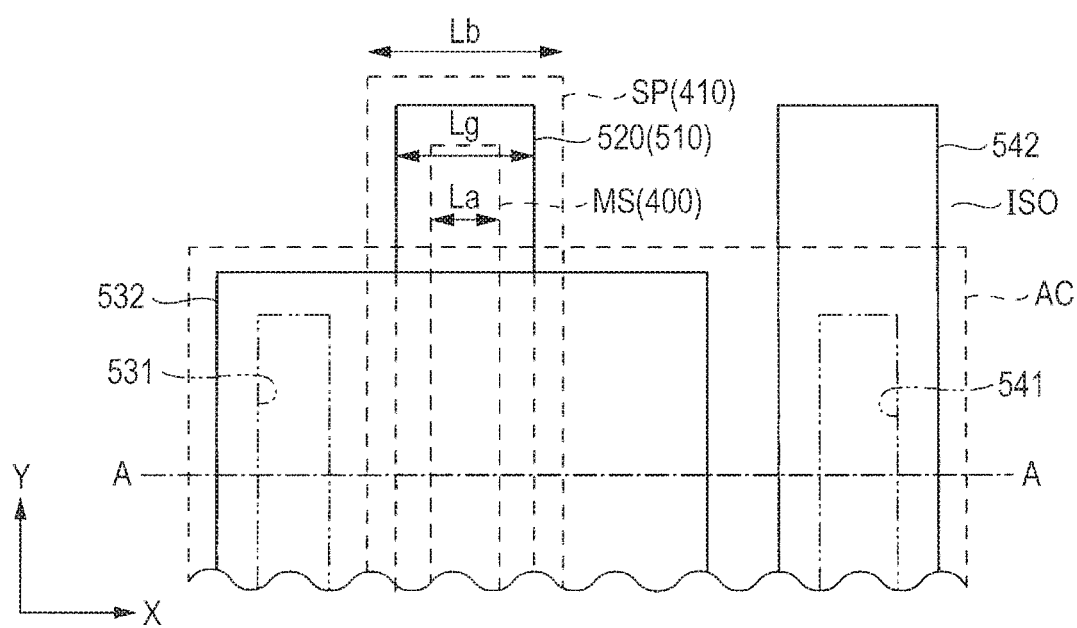
FIG. 2 is a plan view illustrating the configuration of the semiconductor device of the first embodiment.

FIG. 1 is a sectional view illustrating a configuration of the semiconductor device of the first embodiment. FIG. 2 is a plan view illustrating the configuration of the semiconductor device of the first embodiment. The sectional view of FIG. 1 corresponds to a portion A-A of FIG. 2, for example.

The semiconductor device of the first embodiment illustrated in FIG. 1 is a metal-oxide-semiconductor field effect transistor (MOSFET, or MISFET) using a nitride semiconductor. The semiconductor device may also be referred to as high electron mobility transistor (HEMT).

In the semiconductor device of the first embodiment, as shown in FIG. 1, a first nitride semiconductor layer 100, a second nitride semiconductor layer 200, and a third nitride semiconductor layer 300 are provided in order on a substrate 12. A mesa part MS including a fourth nitride semiconductor layer 400 is provided on a part of the third nitride semiconductor layer 300. A nucleation layer and an overlying high-resistance buffer layer may be formed over the substrate 12 before formation of the first nitride semiconductor layer 100 and others.

For, example, a semiconductor substrate made of silicon (Si) exposing a (111) plane may be used as the substrate 12.

In addition to the silicon substrate, a SiC or sapphire substrate may be used as the substrate 12. A substrate made of GaN may also be used. In such a case, the nucleation layer may be omitted.

The nucleation layer includes a nitride semiconductor layer. For example, an aluminum nitride (AlN) layer can be used as the nucleation layer. The high-resistance buffer layer includes one or more nitride semiconductor layers each including a nitride semiconductor doped with an impurity forming a deep level. For example, a superlattice structure including a plurality of nitride semiconductor layers, which may be referred to as superlattice layer, is formed by repeatedly forming a film stack (AlN/GaN film) of a gallium nitride (GaN) layer and an aluminum nitride (AlN) layer, and can be used as the high-resistance buffer layer BUF.

Any of the nitride semiconductor layers (III-V compound semiconductor layers) over the substrate 12 is typically formed by group III face growth.

As described above, the first nitride semiconductor layer 100, the second nitride semiconductor layer 200, and the third nitride semiconductor layer 300 are provided in order over the substrate 12. The mesa part MS including the fourth nitride semiconductor layer 400 is provided on a part of the third nitride semiconductor layer 300.

The second nitride semiconductor layer 200 has an electron affinity (EA) equal to or larger than that of the first nitride semiconductor layer 100 (EA100≤EA200).

The third nitride semiconductor layer 300 has an electron affinity smaller than that of the first nitride semiconductor layer 100 (EA100≥EA300).

The fourth nitride semiconductor layer 400 has an electron affinity larger than that of the first nitride semiconductor layer 100 (EA400>EA100).

The first nitride semiconductor layer 100, which may be referred to as buffer layer, is made of, for example, AlGaN. The second nitride semiconductor layer 200, which may be referred to as channel layer, is made of, for example, GaN. The third nitride semiconductor layer 300, which may be referred to as barrier layer (electron supply layer), is made of, for example, AlGaN. However, the third nitride semiconductor layer 300 has a larger Al content than the first nitride semiconductor layer 100. The mesa part MS, which may be referred to as 2DEG suppression layer (2DEG cancel layer), is an undoped layer, and is made of, for example, i-GaN, InGaN, or AlGaN having a smaller Al content than the first nitride semiconductor layer 100. That is, the mesa part MS is not intentionally doped with an n-type or p-type impurity.

A gate electrode 520 is provided over the mesa part MS with a gate insulating film 510 in between. The planar shape of the mesa part MS is a rectangular shape having a long side in a Y direction (see FIG. 2). A side part SP is provided on both sides of the mesa part MS. In the first embodiment, the side part SP, which includes the fourth nitride semiconductor layer (400) as with the mesa part MS, is a portion (thin film part, second thickness part) that is provided on both sides of the mesa part MS and has a smaller thickness than the mesa part (first thickness part) MS.

A stack of the gate insulating film 510 and the gate electrode 520 has a planar shape being a rectangular shape having a long side in the Y direction (see FIG. 2). A length Lg in an X direction (length in a direction in which current flows from a drain electrode to a source electrode, i.e., in a gate length direction) of the gate electrode 520 is larger than the length La in the X direction of the mesa part MS. The length Lg in the X direction (length in the direction in which current flows from the drain electrode to the source electrode, i.e., in the gate length direction) of the gate electrode 520 is smaller than the length Lb in the X direction of the fourth nitride semiconductor layer (a composite of the mesa part MS and the side part SP) 400 (La<Lg<Lb). Hence, an end portion of the gate electrode 520 is located above the mesa part MS.

An interlayer insulating film 600 is provided over the gate electrode 520 (see FIG. 1). A source electrode 532 and a drain electrode 542 are provided over the third nitride semiconductor layer (barrier layer) 300 and on both sides of the fourth nitride semiconductor layer (MS, SP) 400. For example, contact holes (coupling holes) 531 and 541 are provided in the interlayer insulating film 600, and the source electrode 532 and the drain electrode 542 are disposed within and over the contact holes (coupling holes) 531 and 541, respectively. In the first embodiment, the source electrode 532 extends to above the gate electrode 520. Specifically, the source electrode 532 is disposed over the gate electrode 520 with the interlayer insulating film 600 in between. Such a configuration, in which the source electrode 532 covers the gate electrode 520, allows a source field plate effect to be exhibited. Such a field plate part (a portion of the source electrode 532 located above the gate electrode) may be omitted.

The two-dimensional electron gas (2DEG) is generated at the interface between the second nitride semiconductor layer 200 and the third nitride semiconductor layer 300 due to piezo polarization (caused by a difference in lattice constant) and spontaneous polarization. However, since the mesa part MS is provided below the gate electrode 520 with the gate insulating film 510 in between, the third nitride semiconductor layer 300 in contact with the mesa part MS is affected by the lattice constant of the mesa part MS, and thus a piezo polarization component decreases at the interface between the second nitride semiconductor layer 200 and the third nitride semiconductor layer 300, so that generation of 2DEG is suppressed below the mesa part MS. Hence, only when a predetermined potential (threshold potential) is applied to the gate electrode 520, a channel is formed below the mesa part MS below which generation of 2DEG is suppressed, and the transistor is on. In this way, the transistor of the first embodiment has the normally-off characteristics.

In the first embodiment, as described above, the side part SP is provided on both sides of the mesa part MS. The side part SP, which includes the fourth nitride semiconductor layer 400 as with the mesa part MS, has a smaller thickness than the mesa part MS.

The side part (thin film part) SP is thus provided on both sides of the mesa part MS, which makes it possible to reduce on resistance of the transistor.

Figure 3:
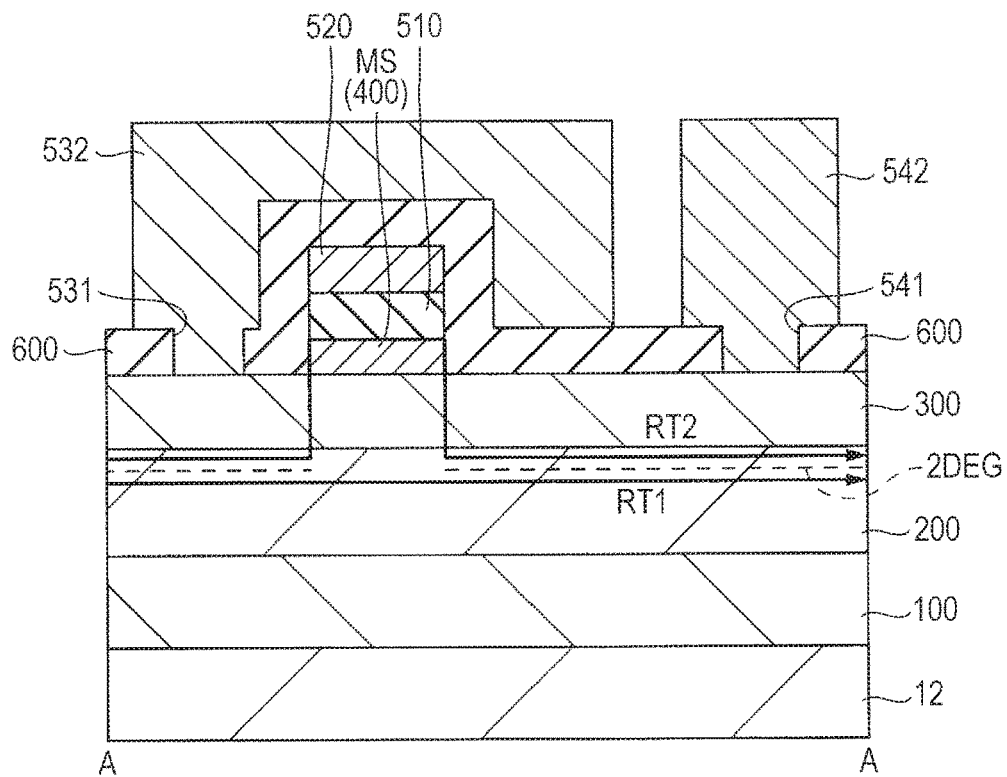
FIG. 3 is a sectional view illustrating a configuration of a semiconductor device of a first comparative example.
Figure 4:
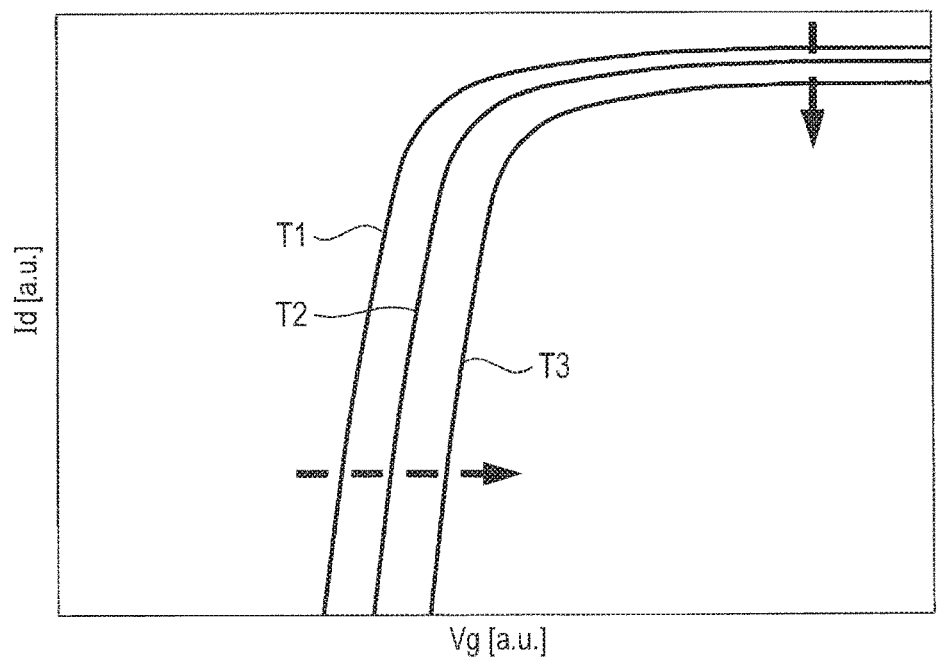
FIG. 4 illustrates I-V characteristics of the semiconductor device of the first comparative example.

FIG. 3 is a sectional view illustrating a configuration of a semiconductor device of a first comparative example. FIG. 4 illustrates I-V characteristics of the semiconductor device of the first comparative example. For example, when the gate electrode 520, the gate insulating film 510, and the mesa part MS are processed together so as to have the same shape in planar view as in the semiconductor device of the first comparative example of FIG. 3, on resistance increases due to resistance of a second channel. The second channel, which is different from the above-described channel (hereinafter, referred to as first channel) for connection of the 2DEG suppression part, is an undesired channel formed between the gate insulating film 510 and the mesa part MS.

In particular, when the thickness of the mesa part MS is increased to increase the threshold voltage of the semiconductor device in order to improve the normally-off characteristics, a notable increase in on resistance is found. As shown in FIG. 4, when the thickness of the mesa part (2DEG suppression layer) MS is increased in the order of T1, T2, and T3, the threshold voltage (Vg) correspondingly increases and the waveform is shifted to the right, while the drain current (Id) correspondingly decreases. The reason for this is considered as follows. That is, as shown in FIG. 3, an unintended current path (current path RT2 passing through the second channel) is formed instead of a current path RT1 passing through the first channel connecting the 2DEG suppression part, causing an increase in on resistance. Capacitance-voltage characteristics (C-V characteristics) of the semiconductor device of the first comparative example have taught that electrons are not accumulated below the mesa part (2DEG suppression layer) MS, i.e., no first channel is formed, but electrons are accumulated between the gate insulating film 510 and the mesa part MS, i.e., the second channel is formed.

Figure 5:
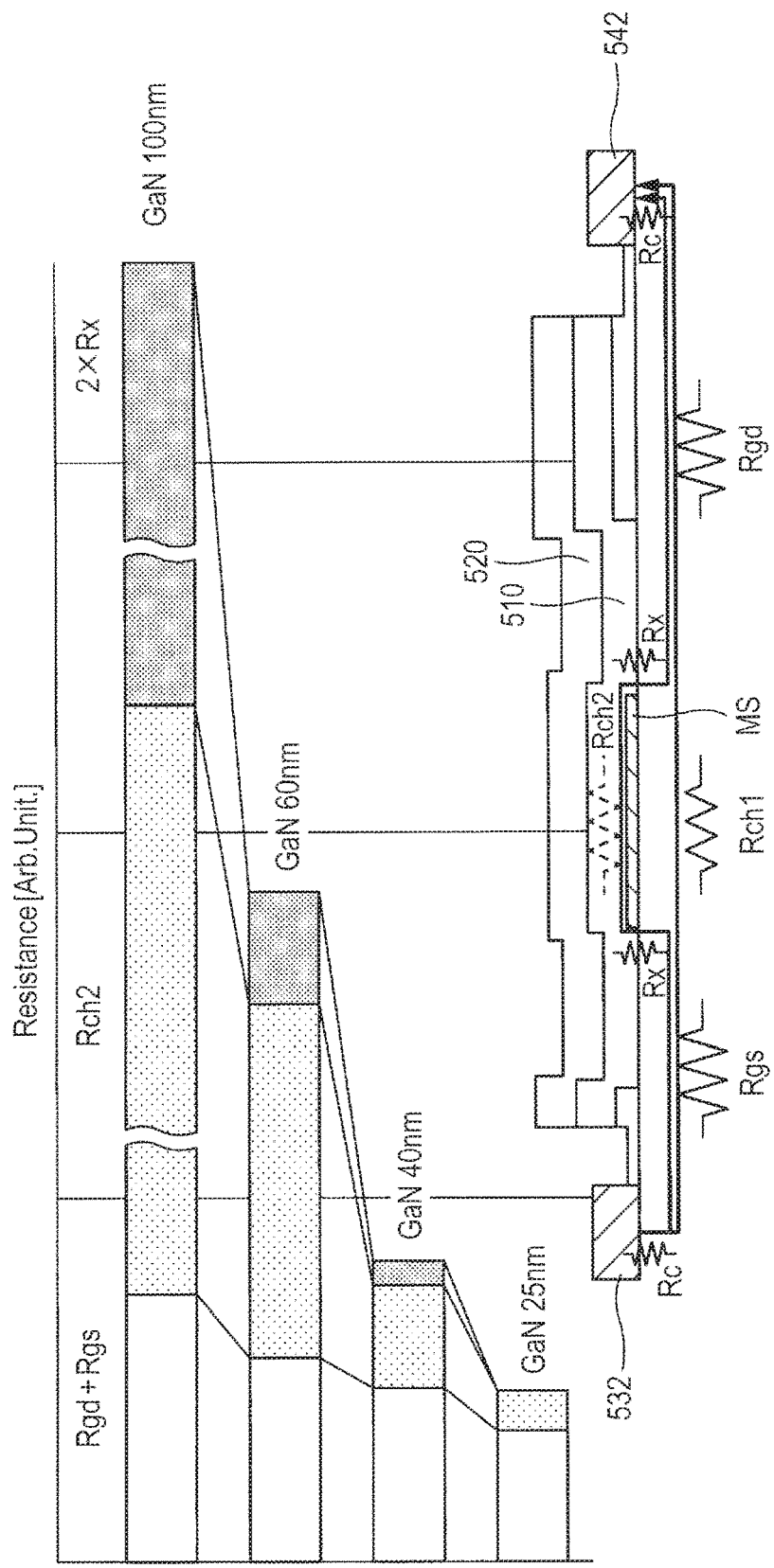
FIG. 5 shows analysis results of resistance components of the semiconductor device of the first comparative example.

FIG. 5 shows analysis results of resistance components of the semiconductor device of the first comparative example. FIG. 5 shows results of analysis of the resistance components (Rgs, Rch1, Rgd, Rx, Rch2) of various sites of the semiconductor device of the first comparative example. Rch1 denotes the resistance of the first channel, Rch2 denotes the resistance of the second channel, Rgs denotes the resistance between the gate electrode and the source electrode, Rgd denotes the resistance between the gate electrode and the drain electrode, and Rx denotes the resistance of a sidewall of the mesa part MS. As shown in FIG. 5, when the thickness of the undoped mesa part (i-GaN) MS is increased from 25 to 100 nm, the resistance Rch2 of the second channel abruptly increases. When the resistance Rch2 of the second channel thus increases, the resistance Rx of the sidewall of the mesa part MS also increases, resulting in a further increase in on resistance.

The reason for such a phenomenon is considered as follows. That is, in a state where an electric field is applied to the mesa part (2DEG suppression layer) MS from the gate electrode, a leakage current flows along the sidewall (an end portion) of the mesa part, causing formation of the second channel according to the voltage from the gate electrode. In this state, since a sufficient electric field is not applied to the 2DEG suppression part (first channel formation part), resistance of the 2DEG suppression part is not reduced, i.e., resistance of the first channel is not reduced. Since the end portion of the mesa part (2DEG suppression layer) MS has a high resistance, the current path (RT2) passing through the second channel also has a high resistance, leading to a high on resistance.

Figure 6:
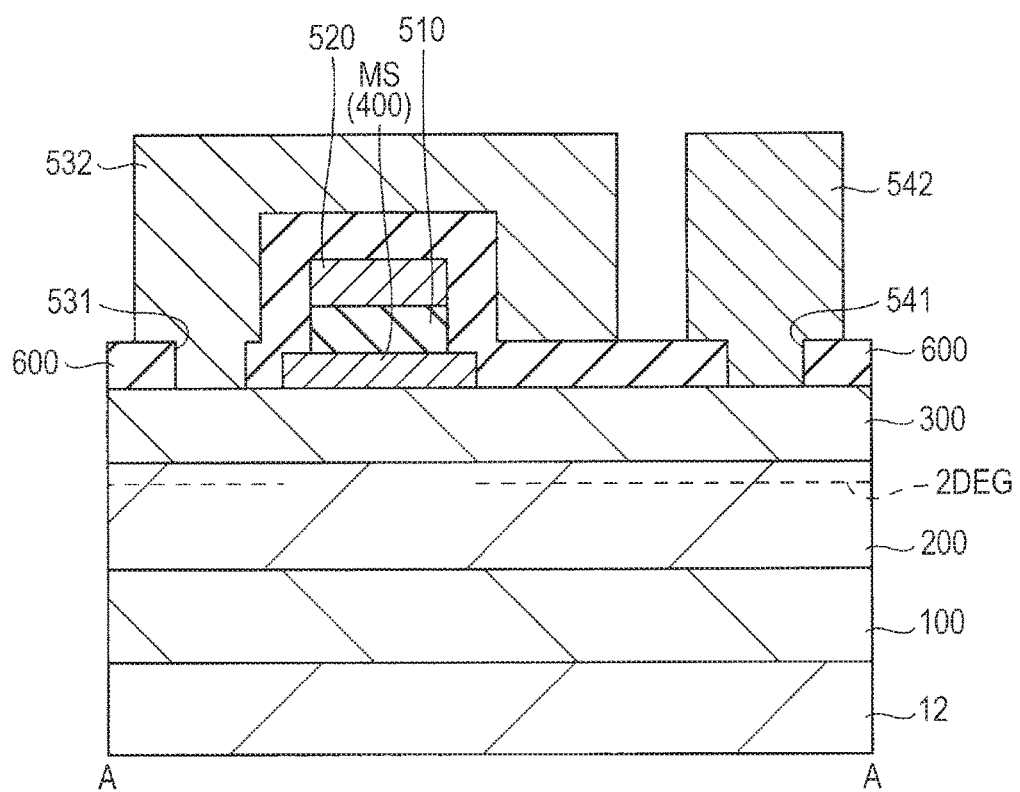
FIG. 6 is a sectional view illustrating a configuration of a semiconductor device of a second comparative example.

FIG. 6 is a sectional view illustrating a configuration of a semiconductor device of a second comparative example. As described with reference to FIG. 5, the current path (RT2) passing through the second channel becomes a leakage path due to the electric field applied from the gate electrode to the end portion of the mesa part (2DEG suppression layer) MS. To address such a problem, a structure of the second comparative example is considered as a measure. That is, the end portion of the mesa part (2DEG suppression layer) MS is located on an outer side than the gate electrode 520. In such a case, a large distance is given from the end portion of the mesa part (2DEG suppression layer) MS to the gate electrode 520, so that a sufficient electric field is not applied to the end portion. It is therefore possible to suppress formation of the leakage path caused by the current path (RT2) passing through the second channel. In the configuration of the semiconductor device of the second comparative example, however, 2DEG disappears in a portion directly below the mesa part (2DEG suppression layer) MS on an outer side than the gate electrode 520, and no channel is formed in the portion because a sufficient electric field is not applied to the portion from the gate electrode 520, and thus a so-called offset structure is formed, and eventually on resistance inevitably increases.

On the other hand, in the first embodiment, since the side part SP is provided at the end portion of the mesa part (2DEG suppression layer) MS (see FIG. 1 and others), a large distance is given from an end portion of the side part SP to the gate electrode 520, so that a sufficient electric field is not applied to the side part SP. It is therefore possible to suppress the leakage caused by the current path (RT2) passing through the second channel. To put it another way, resistance of the current path (RT2) passing through the second channel increases, and thus the original current path (RT1) passing through the first channel becomes mainstream.

The side part SP has a smaller 2DEG suppression force than the mesa part MS, and thus 2DEG occurs below the side part SP. To put it another way, generation of 2DEG is suppressed below the mesa part MS while being unsuppressed below the side part SP. To put it still another way, the function of the suppression layer is reduced below the side part SP. Hence, the offset structure is not formed in the semiconductor device of the first embodiment.

As described above, according to the first embodiment, it is possible to reduce the leakage current at the end portion of the mesa part (2DEG suppression layer) MS, and maintain the generation region of 2DEG up to the end of the gate electrode 520, so that the leakage current and on resistance can be reduced together. In particular, according to the first embodiment, even if the thickness of the undoped mesa part (2DEG suppression layer) MS is increased to increase the threshold potential, the leakage current and the on resistance can be reduced together.

More specifically, in the first embodiment, the side part SP is formed as "thin film part" having a smaller thickness than the mesa part MS. For example, in light of etching controllability, the thickness of the thin film part is desirably as small as possible within a range in which no tunneling current occurs at an electric field caused by the gate electrode during operation of the semiconductor device (for example, within a range equal to or less than 1 MV/cm). For example, electric field strength is about 0.6 MV/cm for the thickness of the thin film part of about 20 nm under a condition that the gate voltage is about 10 V and the thickness of the gate insulating film is about 100 nm. In this way, no tunneling current occurs, and the suppression effect of 2DEG is reduced so that 2DEG can be sufficiently generated. As described above, for example, the thickness of the thin film part is adjusted to about 20 nm, thereby 2DEG can be generated below the thin film part.

For example, when a distance (elongated distance, extended distance, (Lb–Lg)/2) between the gate electrode 520 and the end portion of the side part SP is 0.2 µm or more under a condition that the gate voltage is about 10 V and the thickness of the gate insulating film is about 100 nm, the electric field applied from the gate electrode to the sidewall of the mesa part is sufficiently low. Such a low electric field is less likely to induce the leakage path caused by the current path (RT2) passing through the second channel. An end portion of the gate electrode 520 is located on the side part (thin film part) SP, so that an overlap region is formed between the gate electrode 520 and the side part (thin film part) SP. The width ((Lg–La)/2) of the overlap region is about 0.1 to 0.2 µm, for example. The overlap region between the gate electrode 520 and the side part (thin film part) SP is thus provided, thereby even if the gate electrode 520 is disposed on the mesa part MS in a misalignment manner due to mask misalignment, it is possible to prevent disappearance of 2DEG and formation of the offset structure.

Figure 7:
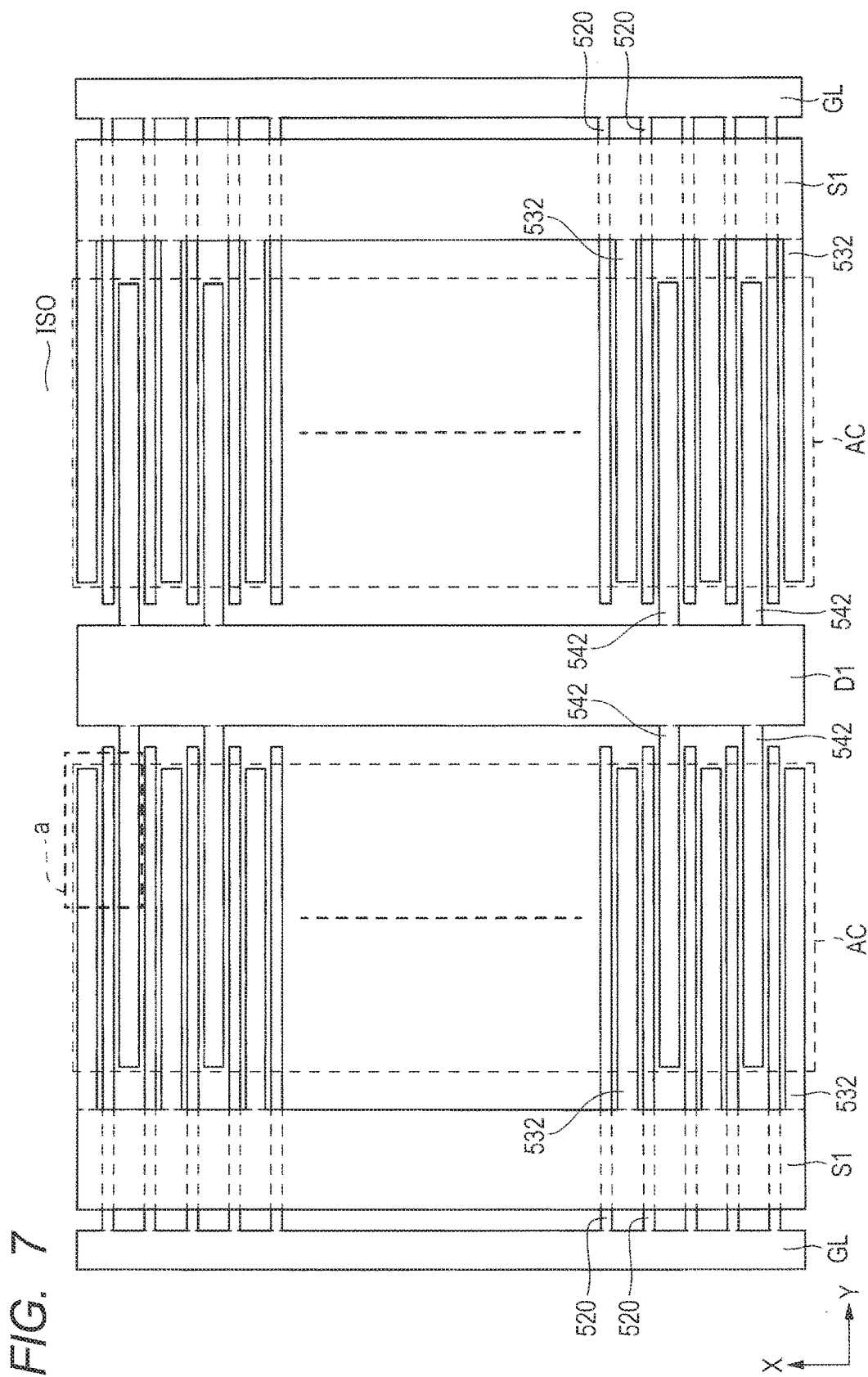
FIG. 7 is a plan view illustrating the configuration of the semiconductor device of the first embodiment.

FIG. 7 is a plan view illustrating the configuration of the semiconductor device of the first embodiment. FIG. 2 corresponds to a part (for example, a region enclosed by a broken line) of FIG. 7. In FIG. 7, the field plate part (a portion of the source electrode 532 located above the gate electrode 520) is omitted for better viewability.

As shown in FIGS. 2 and 7, the planar shape of the drain electrode 542 is a rectangular shape having a long side in the Y direction. The planar shape of the source electrode 532 is a rectangular shape having a long side in the Y direction. A contact hole 541 to be a connection between the drain electrode 542 and the third nitride semiconductor layer (barrier layer) 300 is disposed below the drain electrode 542. The planar shape of the contact hole 541 is a rectangular shape having a long side in the Y direction. A contact hole 531 to be a connection between the source electrode 532 and the third nitride semiconductor layer (barrier layer) 300 is disposed below the source electrode 532. The planar shape of the contact hole 531 is a rectangular shape having a long side in the Y direction.

The gate electrode 520 is disposed between the contact hole 541 below the drain electrode 542 and the contact hole 531 below the source electrode 532. As described above, the gate electrode 520 has a rectangular shape having the long side in the Y direction.

A plurality of drain electrodes 542, gate electrodes 520, and source electrodes 532, which are each shown in FIG. 2, are disposed repeatedly as shown in FIG. 7.

Specifically, as shown in FIG. 7, the planar shape of the drain electrode 542 is the rectangular shape having the long side in the Y direction. The linear drain electrodes 542 are arranged in the X direction at a certain interval. The planar shape of the source electrode 532 is the rectangular shape having the long side in the Y direction. The linear source electrodes 532 are arranged in the X direction at a certain interval. The source electrodes 532 and the drain electrodes 542 are alternately arranged along the X direction. The gate electrode 520 is disposed between the contact hole (541) below the drain electrode 542 and the contact hole (531) below the source electrode 532.

The drain electrodes 542 are coupled to one another by a drain pad (also referred to as terminal part) D1. The drain pad D1 is disposed so as to extend in the X direction on one end side (for example, in the middle of FIG. 7) of the drain electrode 542. In other words, the drain electrodes 542 are disposed so as to protrude in the Y direction from the drain pad D1 extending in the X direction. Such a shape may be referred to as comblike shape.

The source electrodes 532 are coupled to one another by a source pad (also referred to as terminal part) S1. The source pad S1 is disposed so as to extend in the X direction on one end side (for example, on the left side of FIG. 7) of the source electrode 532. In other words, the source electrodes 532 are disposed so as to protrude in the Y direction from the source pad S1 extending in the X direction. Such a shape may be referred to as comblike shape.

The gate electrodes are coupled to one another by a gate line GL. The gate line GL is disposed so as to extend in the X direction on one end side (for example, on the left side of FIG. 7) of the gate electrode 520. In other words, the gate electrodes 520 are disposed so as to protrude in the Y direction from the gate line GL extending in the X direction. The gate line GL is coupled to an undepicted gate pad provided on one side (for example, a top or bottom side of FIG. 7) in the X direction of the gate line GL.

The mesa part MS is disposed below, in sectional view, the gate electrodes 520 and the gate line GL with the gate insulating film 510 in between, and the side part SP is disposed on both sides of the mesa part MS (see FIG. 2).

The gate line GL, the gate electrodes 520, the source pad S1, the source electrodes 532, and the drain electrodes 542 are disposed in a bilaterally symmetric manner with the drain pad D1 in the middle of FIG. 7 as an axis.

The source electrodes 532, the drain electrodes 542, and the gate electrodes 520 are disposed mainly over an active region AC surrounded by an element isolation region ISO. The planar shape of the active region AC is a rectangular shape having a long side in the X direction. The drain pad D1, the gate lines GL, and the source pads S1 are disposed over the element isolation region ISO. The source pad S1 is disposed between the active region AC and the gate line GL. In the element isolation region ISO, an ion species such as boron (B) or nitrogen (N) is implanted by ion implantation or the like, so that crystallinity of the nitride semiconductor layer is disrupted.

Description of Manufacturing Method

A method of manufacturing the semiconductor device of the first embodiment is now described with reference to FIGS. 8 to 23 while the configuration of the semiconductor device is further clarified. FIGS. 8 to 23 include sectional views and plan views illustrating a manufacturing process of the semiconductor device of the first embodiment.

Figure 8:
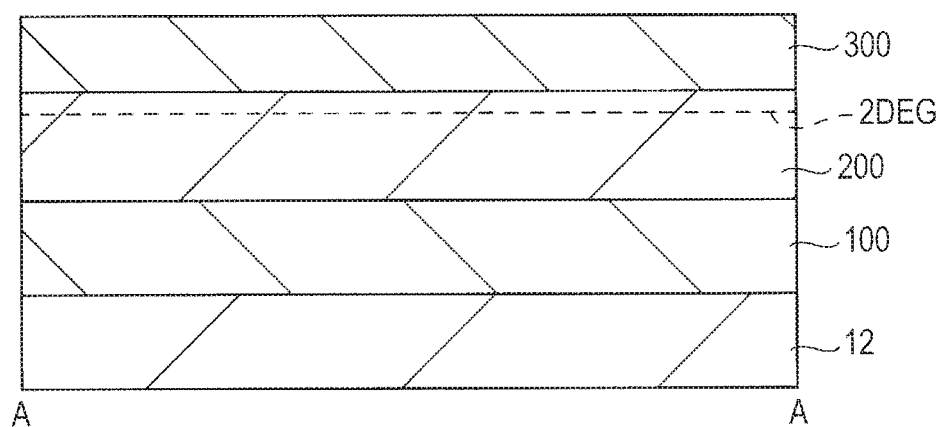
FIG. 8 is a sectional view illustrating a manufacturing process of the semiconductor device of the first embodiment.
Figure 9:
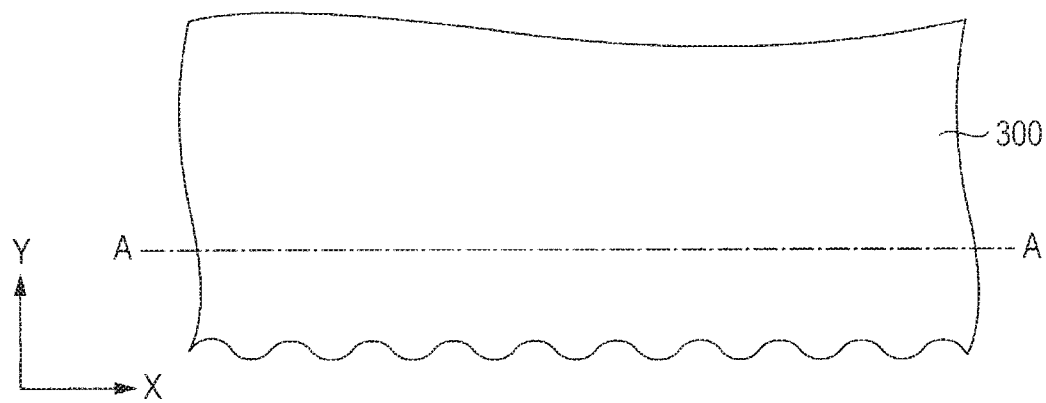
FIG. 9 is a plan view illustrating the manufacturing process of the semiconductor device of the first embodiment.

As show in FIGS. 8 and 9, a substrate 12 is provided, and the first to third nitride semiconductor layers are formed in order. For example, a semiconductor substrate made of silicon (Si) exposing a (111) plane is used as the substrate 12. In addition to such a silicon substrate, a substrate made of SiC or sapphire may be used as the substrate 12. A substrate made of GaN may also be used. Any of subsequently formed nitride semiconductor layers (III-V compound semiconductor layers) is typically formed by group III face growth (gallium face growth or aluminum face growth herein). A nucleation layer and a high-resistance buffer layer may be formed before the first to third nitride semiconductor layers are formed in order. For example, an aluminum nitride (AlN) layer can be used as the nucleation layer, which can be formed by epitaxial growth using a metal organic chemical vapor deposition (MOCVD) process, for example. A superlattice structure, which is formed by repeatedly stacking a film stack (AlN/GaN film) of a gallium nitride (GaN) layer and an aluminum nitride (AlN) layer, can be used as the high-resistance buffer layer BUF. Such a superlattice structure can be formed by alternate epitaxial growth of the gallium nitride (GaN) layer and the aluminum nitride (AlN) layer using the metal organic chemical vapor deposition process, for example. Subsequently, for example, an AlGaN layer is epitaxially grown about 1000 nm as the first nitride semiconductor layer (buffer layer) 100 on the substrate 12 using a metal organic chemical vapor deposition process or the like. For a constituent element ratio of the AlGaN layer, X is 0 to 0.1 ($0 \leq X \leq 0.1$) for $Al_xGa_{1-x}N$, for example. The AlGaN layer is an undoped layer, for example. That is, the AlGaN layer is not intentionally doped with an n-type or p-type impurity.

Subsequently, a GaN layer is epitaxially grown about 50 nm as the second nitride semiconductor layer (channel layer) 200 on the first nitride semiconductor layer 100 using a metal organic chemical vapor deposition process or the like.

An AlGaN layer is epitaxially grown about 20 nm as the third nitride semiconductor layer (barrier layer) 300 on the second nitride semiconductor layer 200 using a metal organic chemical vapor deposition process or the like. For a constituent element ratio of the AlGaN layer, Y is larger than X and smaller than 0.4 ($X<Y<0.4$) for $Al_yGa_{1-y}N$, for example.

As described above, two-dimensional electron gas (2DEG) is generated at the interface between the second nitride semiconductor layer (channel layer) 200 and the third nitride semiconductor layer (barrier layer) 300.

Figure 10:
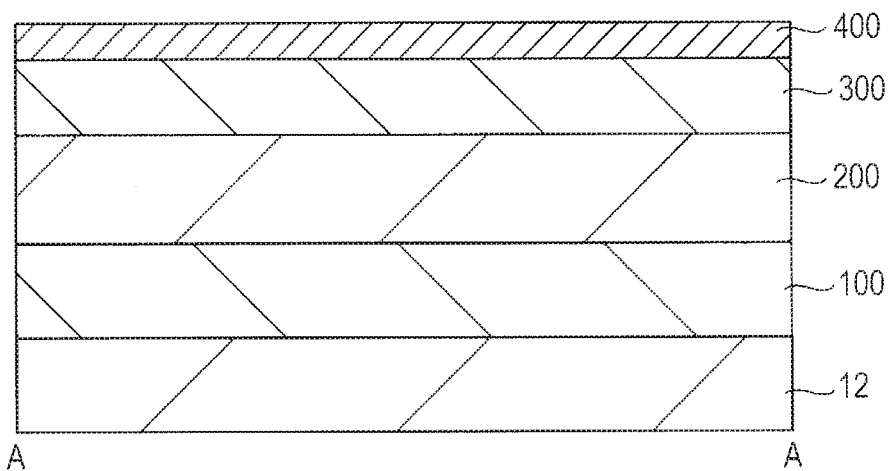
FIG. 10 is a sectional view illustrating the manufacturing process of the semiconductor device of the first embodiment.
Figure 11:
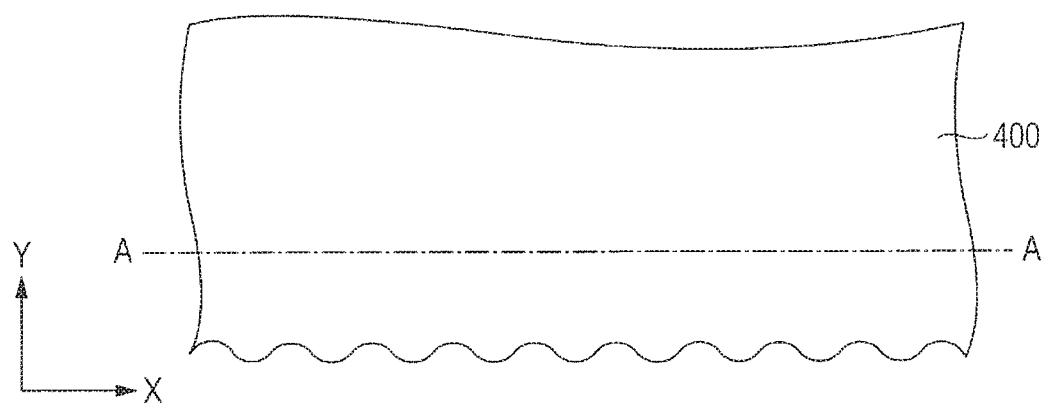
FIG. 11 is a plan view illustrating the manufacturing process of the semiconductor device of the first embodiment.

Subsequently, as shown in FIGS. 10 and 11, an AlGaN layer or an InGaN layer is epitaxially grown about 100 nm as the fourth nitride semiconductor layer 400 on the third nitride semiconductor layer 300 using a metal organic chemical vapor deposition process or the like. For a constituent element ratio of the AlGaN layer, Z is smaller than X ($0 \leq Z<X$) for $Al_zGa_{1-z}N$, for example. The 2DEG disappears through such formation of the fourth nitride semiconductor layer 400.

The first to fourth nitride semiconductor layers 100 to 400 are each grown while a carrier gas and a source gas are introduced into an apparatus, for example. A gas containing a constitutional element of the nitride semiconductor layer (AlGaN layer or GaN layer) is used as the source gas. For example, for formation of the AlGaN layer, trimethyl aluminum (TMAl), trimethyl gallium (TMG), and ammonia are used as the source gases of Al, Ga, and N, respectively. For example, for formation of the GaN layer, trimethyl gallium (TMG) and ammonia are used as the source gases of Ga and N, respectively. Thus, in the epitaxial growth process, the constituent element ratio of each layer can be easily and accurately adjusted by controlling the flow rate of the source gas. Furthermore, in the epitaxial growth process, layers having different element configurations can be formed easily and continuously by switching the source gas.

Figure 12:
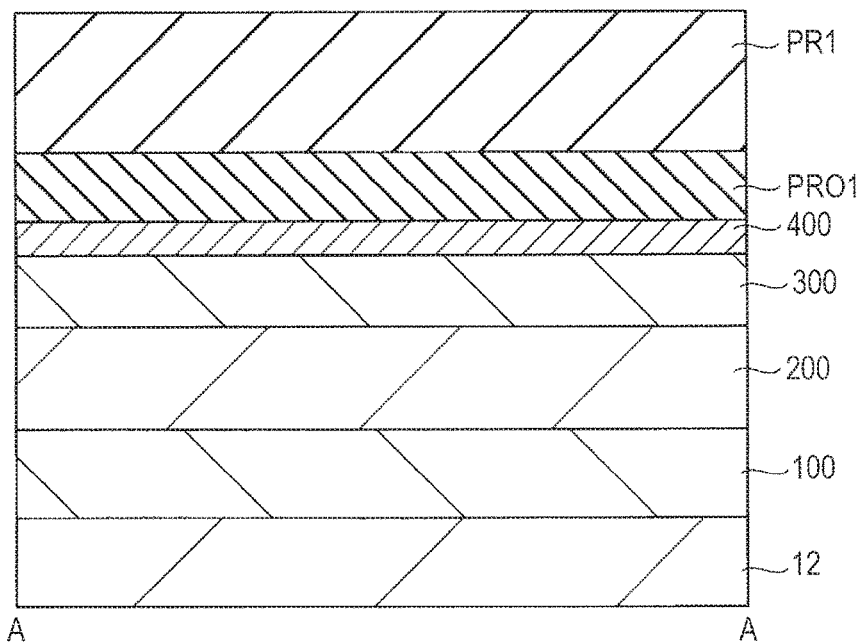
FIG. 12 is a sectional view illustrating the manufacturing process of the semiconductor device of the first embodiment.
Figure 13:
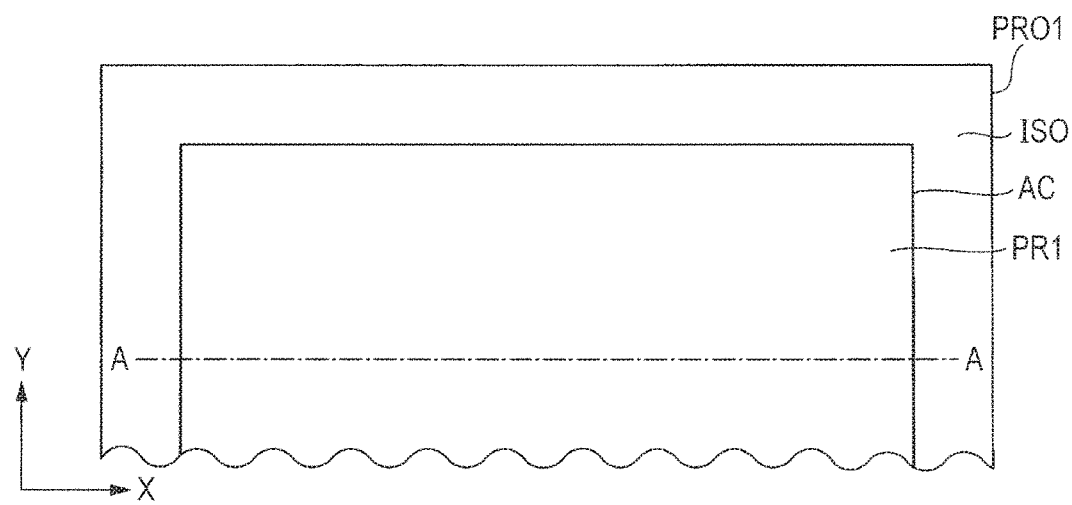
FIG. 13 is a plan view illustrating the manufacturing process of the semiconductor device of the first embodiment.

Subsequently, as shown in FIGS. 12 and 13, a protective film (for example, silicon oxide film) PRO1 is formed over the fourth nitride semiconductor layer 400, and a photoresist film (mask film) PR1 having an opening in the element isolation region ISO is formed on the protective film PRO1. Subsequently, boron ions are implanted through the protective film PRO1 with the photoresist film PR1 as a mask to form the element isolation region ISO. The ion species such as boron (B) or nitrogen (N) is thus implanted, thereby crystallinity of the nitride semiconductor layer is disrupted, so that the element isolation region ISO is formed.

For example, boron ions are implanted at a density of about $1 \times 10^{14}$ (1E14) to $4 \times 10^{14}$ (1E14) $cm^{-2}$ into part of the stack including the first to fourth nitride semiconductor layers 100 to 400. The implantation energy is about 100 to 200 keV, for example. The implantation condition of the boron ions is adjusted such that the implantation depth, i.e., the bottom of the element isolation region ISO is located below the bottom surface of the third nitride semiconductor layer (barrier layer) 300, for example. In this way, the element isolation region ISO is formed. The region surrounded by the element isolation region ISO corresponds to the active region AC. As shown in FIGS. 13 and 7, the active region AC has a rectangular shape. Subsequently, the photoresist film PR1 is removed by plasma stripping processing or the like.

Figure 14:
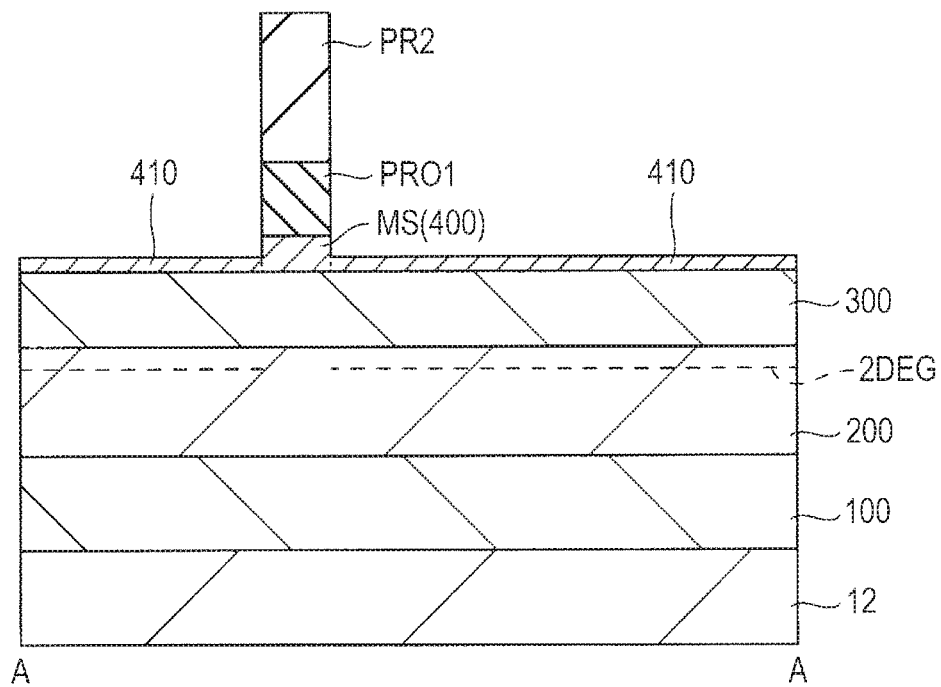
FIG. 14 is a sectional view illustrating the manufacturing process of the semiconductor device of the first embodiment.
Figure 15:
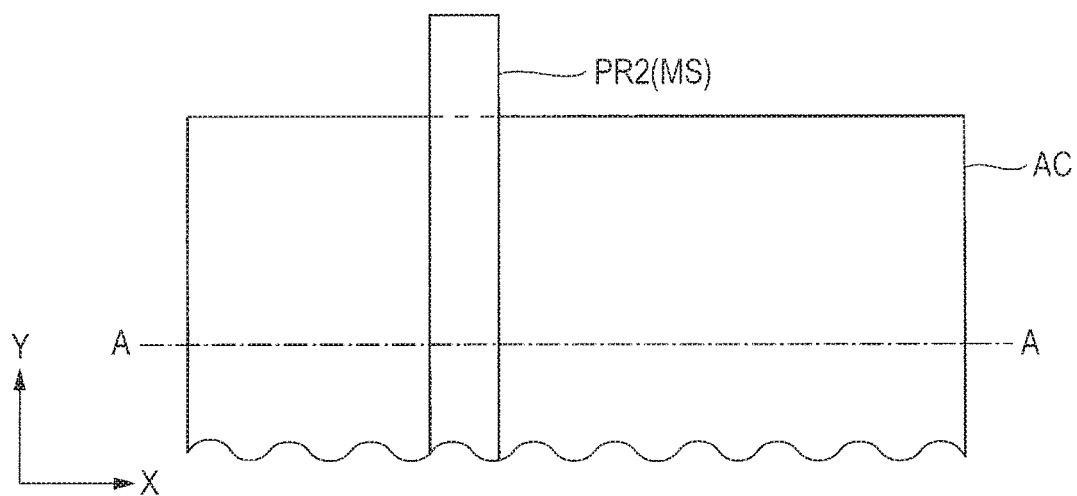
FIG. 15 is a plan view illustrating the manufacturing process of the semiconductor device of the first embodiment.

Subsequently, as shown in FIGS. 14 and 15, the photoresist film PR2 is formed by photolithography processing in a formation region (first rectangular shape in planar view) of the mesa part MS over the protective film PRO1. The photoresist film PR2 is used as a mask so that the protective film PRO1 is etched and the underlying fourth nitride semiconductor layer 400 is partway etched. As a result, the mesa part MS and a thin film part 410 on both sides of the mesa part MS are formed. A part of the thin film part 410 forms the side part SP. Subsequently, the photoresist film PR2 is removed by plasma stripping processing or the like. Furthermore, the protective film PRO1 is removed.

In this stage, the mesa part MS is formed partially (for example, in a rectangular shape having a long side in the Y direction) over the third nitride semiconductor layer (barrier layer) 300, and 2DEG has still disappeared below the mesa part MS. On the other hand, 2DEG suppression force is small below the thin film part 410 on both sides (in the periphery) of the mesa part MS, so that 2DEG is regenerated below the thin film part 410.

Figure 16:
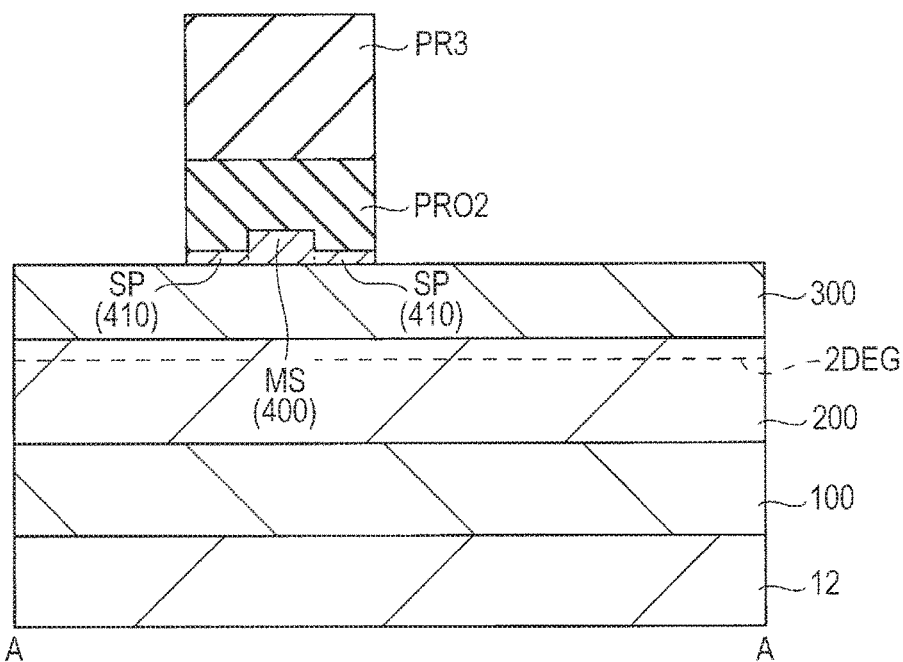
FIG. 16 is a sectional view illustrating the manufacturing process of the semiconductor device of the first embodiment.
Figure 17:
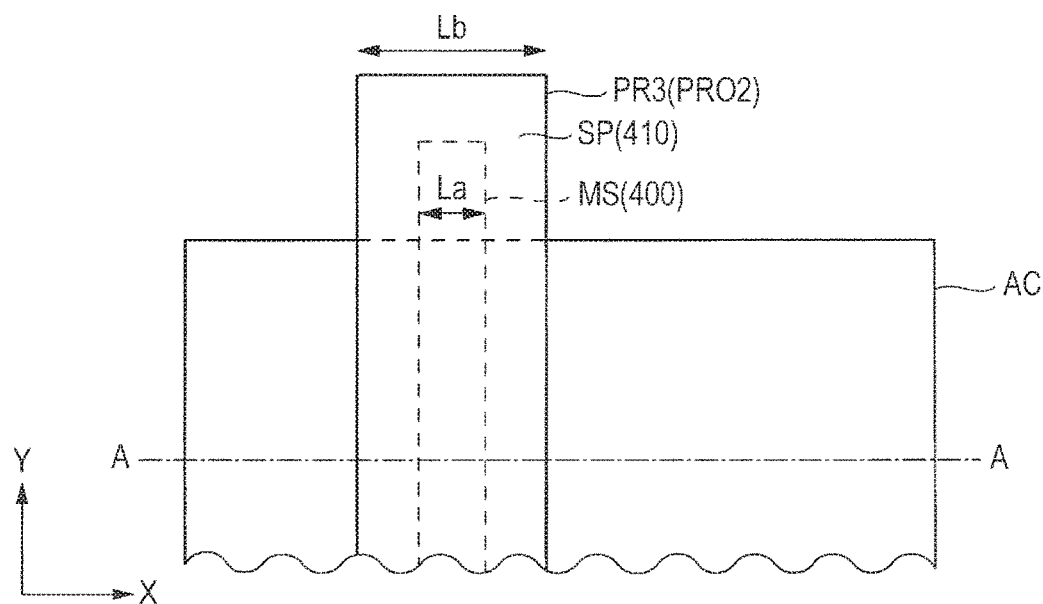
FIG. 17 is a plan view illustrating the manufacturing process of the semiconductor device of the first embodiment.

Subsequently, as shown in FIGS. 16 and 17, a protective film (for example, silicon oxide film about 10 nm thick) PRO2 is formed over the mesa part MS and the thin film part 410, and a photoresist film PR3 is formed over the protective film PRO2 in a region (second rectangular shape in planar view) slightly larger than the formation region of the mesa part MS. The protective film PRO2 and the thin film part 410 including the fourth nitride semiconductor layer 400 are etched with the photoresist film PR3 as a mask. As a result, the mesa part MS and the side part SP on both sides of the mesa part MS are formed.

Figure 18:
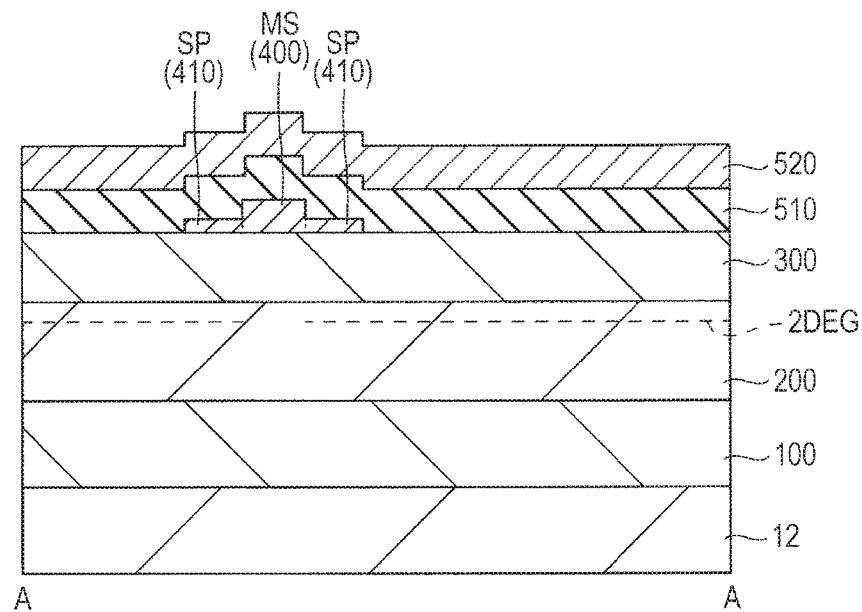
FIG. 18 is a sectional view illustrating the manufacturing process of the semiconductor device of the first embodiment.
Figure 19:
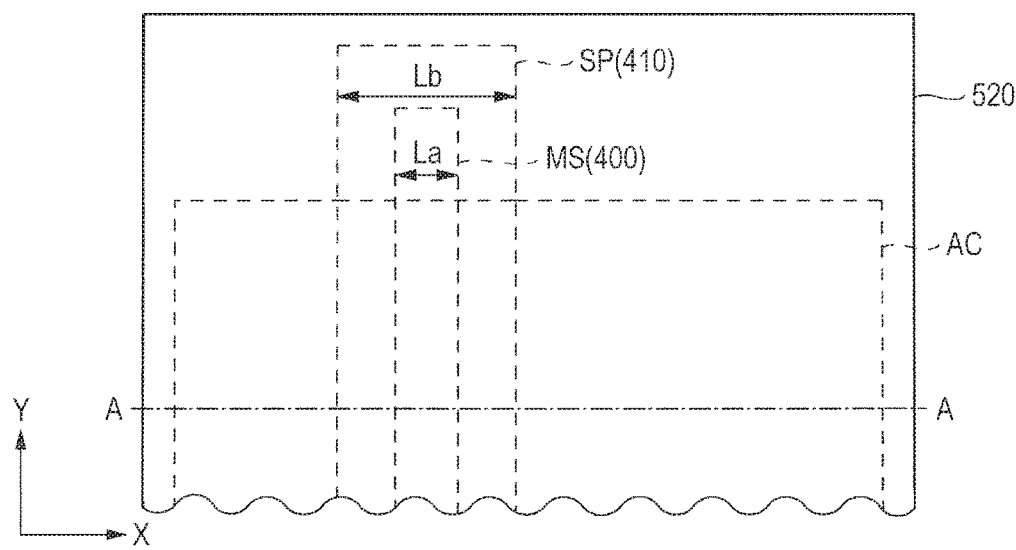
FIG. 19 is a plan view illustrating the manufacturing process of the semiconductor device of the first embodiment.

Subsequently, as shown in FIGS. 18 and 19, an insulating film to be the gate insulating film 510 and a conductive film to be the gate electrode 520 are formed in order over the third nitride semiconductor layer (barrier layer) 300 as well as over the mesa part MS and over the side part SP on both sides of the mesa part MS. For example, an aluminum oxide film ($Al_2O_3$ film) is deposited at a thickness of about 20 to 200 nm using an ALD process or the like as the insulating film for the gate insulating film 510 over the third nitride semiconductor layer (barrier layer) 300 as well as over the mesa part MS and over the side part SP on both sides of the mesa part MS. In addition to the aluminum oxide film, a silicon oxide film and a high-dielectric-constant film having a larger dielectric constant than the silicon oxide film may be used as the insulating film for the gate insulating film 510. A SiN film, a silicon oxynitride (SiON) film, a zirconium oxide ($ZrO_2$) film, and hafnium-based insulating films such as a hafnium oxide ($HfO_2$) film, a hafnium aluminate film, a hafnium oxynitride (HfON) film, a hafnium silicate (HfSiO) film, a hafnium silicon oxynitride (HfSiON) film, and a HfAlO film may be used as the high-dielectric-constant film.

Subsequently, for example, a titanium nitride (TiN) film is deposited as a conductive film for the gate electrode 520 on the insulating film for the gate insulating film 510 at a thickness of about 100 to 200 nm using a sputtering process or the like. The constitutional material or thickness of the conductive film can be appropriately adjusted. Polycrystalline silicon doped with a dopant such as TiN and/or B or P may be used for the conductive film for the gate electrode 520. In addition, Ti, Al, Ni, Pt, and Au, and Si compounds or N compounds thereof may also be used. A multilayer film formed by stacking such material films may also be used. For example, a film stack including an Al film about 100 to 200 nm thick stacked on the titanium nitride (TiN) film may also be used as the conductive film.

Figure 20:
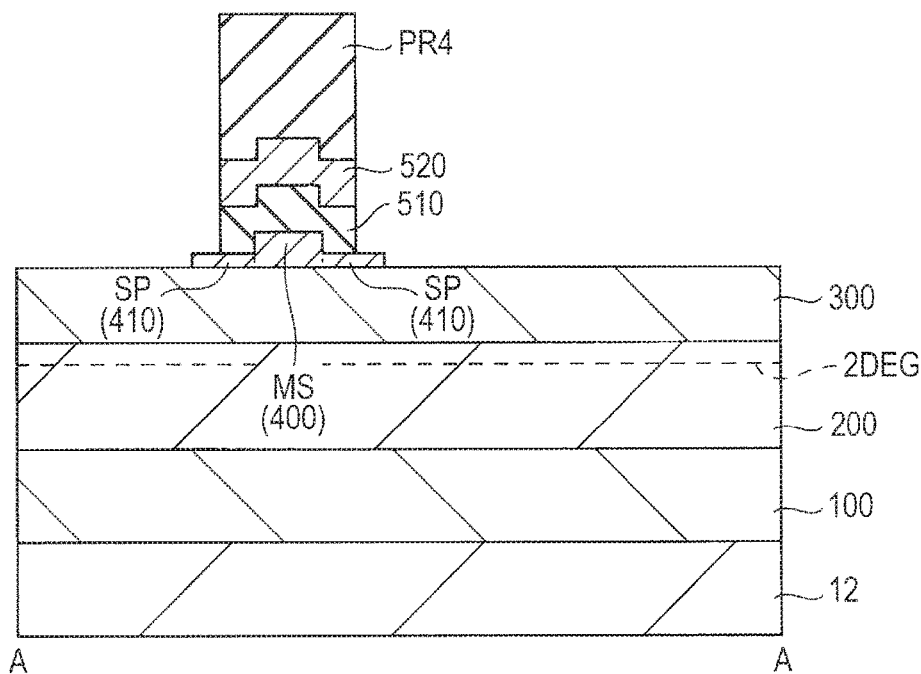
FIG. 20 is a sectional view illustrating the manufacturing process of the semiconductor device of the first embodiment.
Figure 21:
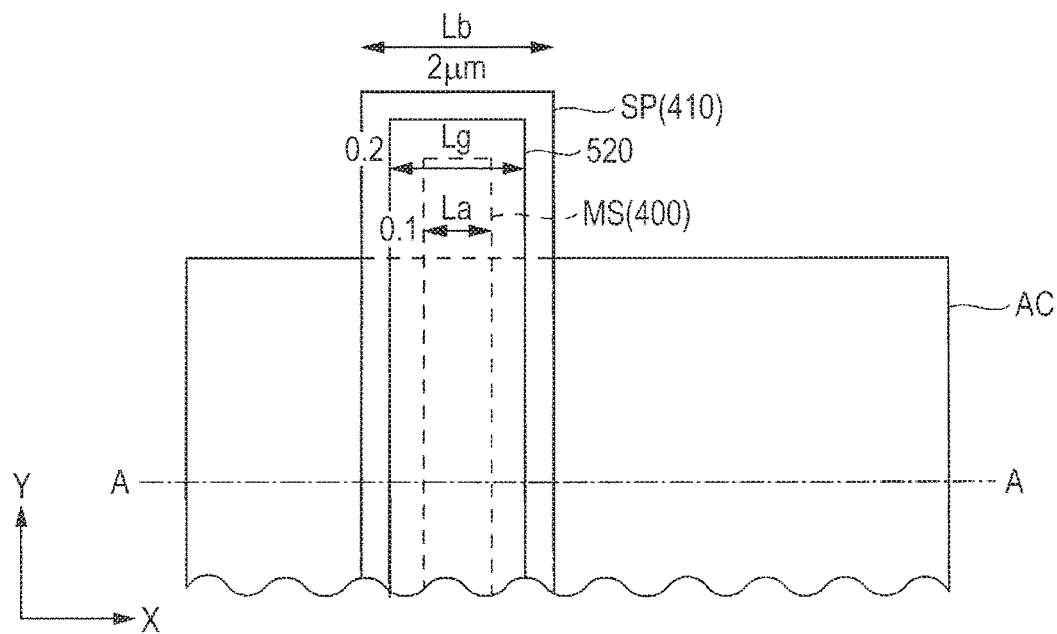
FIG. 21 is a plan view illustrating the manufacturing process of the semiconductor device of the first embodiment.

Subsequently, as shown in FIGS. 20 and 21, a photolithography technique is used to form a photoresist film PR4 in a gate electrode formation region (third rectangular shape slightly larger than the first rectangular shape and slightly smaller than the second rectangular shape in planar view), and etch the TiN film with the photoresist film PR4 as a mask to form the gate electrode 520. Specifically, for example, the TiN film is etched by dry etching using a gas mainly containing $Cl_2$. A fluorine-based gas may also be used in place of the chlorine-based gas such as $Cl_2$. A mixed gas of the chlorine-based gas and the fluorine-based gas may also be used. Subsequently, the aluminum oxide film under the gate electrode (TiN film) 520 is etched. For example, the aluminum oxide film is etched by dry etching using a gas mainly containing $BCl_3$.

As a result, part of the side part SP is exposed on both sides of the gate electrode 520. To put it another way, end portions of the gate electrode 520 are located over the side part SP. In this way, the formation region (first rectangular shape) of the mesa part is made smaller than the formation region (third rectangular shape) of the gate electrode 520 that is made smaller than the formation region (second rectangular shape) of the composite of the mesa part and the side part, thereby even if the gate electrode 520 is formed in misalignment with the mesa part MS due to mask misalignment or the like, it is possible to prevent disappearance of 2DEG and formation of the offset structure.

For example, in light of processing accuracy or mask misalignment during exposure, dimensions may be adjusted such that the gate length (Lg) is 2 μm, the width [(Lb−Lg)/2] is 0.2 μm, and distance between the end portion of the mesa part MS and the end portion of the gate electrode [(Lg−La)/2] is about 0.1 μm.

The mesa part MS is formed partially (for example, in a rectangular shape having a long side in the Y direction) over the third nitride semiconductor layer (barrier layer) 300, and 2DEG has still disappeared below the mesa part MS. On the other hand, 2DEG has been still generated in an exposed portion of the third nitride semiconductor layer 300 on both sides of the composite of the mesa part MS and the side part SP. The side part SP includes the thin film part of the fourth nitride semiconductor layer 400 and has a small 2DEG suppression force, and thus 2DEG has been still generated below the side part SP.

Subsequently, the photoresist film PR4 is removed. The gate electrode 520 may be processed before the photoresist film PR4 is removed and the gate insulating film 510 is etched with the gate electrode 520 as a mask.

Figure 22:
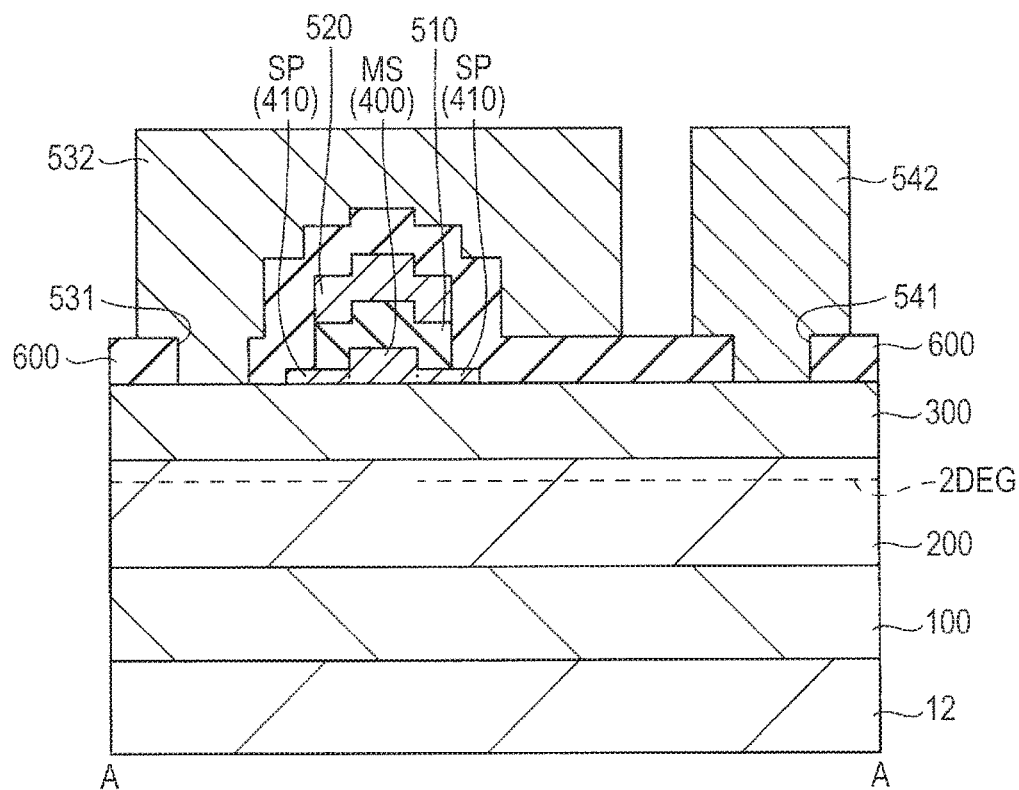
FIG. 22 is a sectional view illustrating the manufacturing process of the semiconductor device of the first embodiment.
Figure 23:
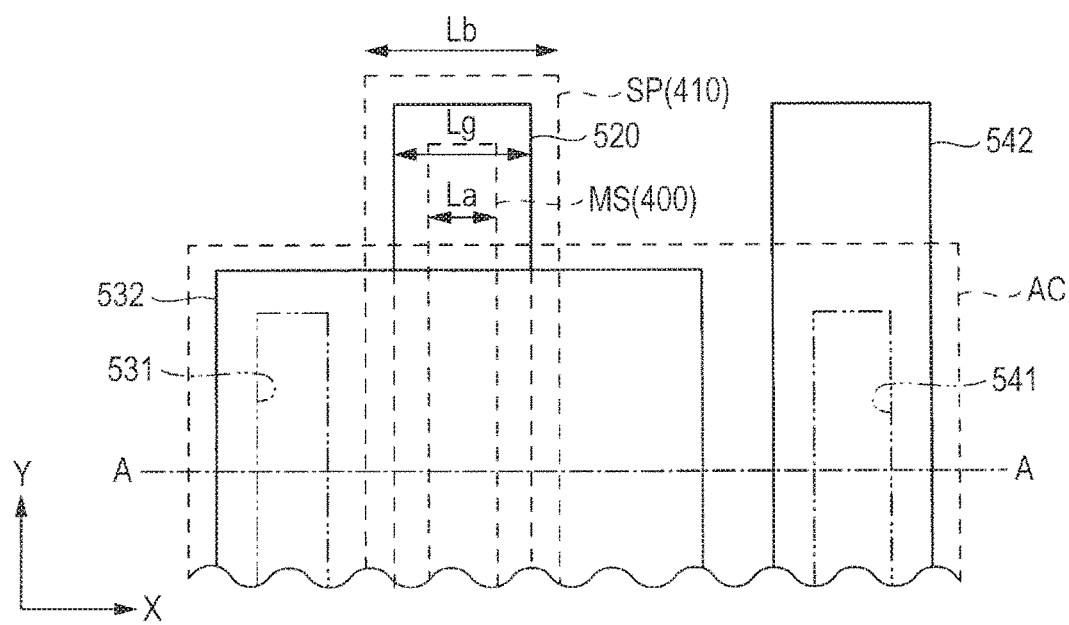
FIG. 23 is a plan view illustrating the manufacturing process of the semiconductor device of the first embodiment.

Subsequently, as shown in FIGS. 22 and 23, an interlayer insulating film 600 is formed over the gate electrode 520. For example, a silicon oxide film is deposited about 2 μm as the interlayer insulating film 600 using a CVD process or the like. A so-called TEOS film, which is formed from tetraethyl orthosilicate as a raw material, may be used as the silicon oxide film. Subsequently, contact holes 531 and 541 are formed in the interlayer insulating film 600 using a photolithography technique and an etching technique. For example, an undepicted photoresist film having respective openings in the source electrode coupling region and the drain electrode coupling region is formed over the interlayer insulating film 600. Subsequently, contact holes 531 and 541 are formed by etching the interlayer insulating film 600 with the photoresist film as a mask. For example, the interlayer insulating film 600 is etched by dry etching using a gas (fluorine-based gas) mainly containing $SF_6$. As a result, the third nitride semiconductor layer (barrier layer) 300 is exposed in each of the source electrode coupling region and the drain electrode coupling region located on both sides of the gate electrode 520.

Subsequently, the source electrode 532 and the drain electrode 542 are formed in the contact holes 531 and 541, respectively, and are each formed over the interlayer insulating film 600. For example, a conductive film is formed over the interlayer insulating film 600 including the insides of the contact holes 531 and 541. For example, an Al/Ti film is formed as a conductive film. For example, a Ti film is formed at a thickness of about 20 nm using a sputtering process or the like over the interlayer insulating film 600 including the insides of the contact holes, and an Al film is formed on the Ti film at a thickness of about 2 μm using a sputtering process or the like. Subsequently, heat treatment is performed. For example, heat treatment is performed at 500° C. for 30 min. As a result, ohmic contact can be established between the conductive film (Al/Ti film) and an underlying layer.

Subsequently, an undepicted photoresist film is formed over the formation regions of the source electrodes 532 and the drain electrodes 542, and the conductive film (Al/Ti film) is etched with the photoresist film as a mask. For example, the conductive film (Al/Ti film) is etched by dry etching using a gas mainly containing $Cl_2$. The source electrode 532 extends to above the gate electrode 520. For example, the source electrode 532 is disposed over the gate electrode 520 with the interlayer insulating film 600 in between. In this way, a configuration is formed so as to cover the gate electrode 520 with the source electrode 532, thereby the source field plate effect can be exhibited.

The constitutional material or thickness of the conductive film configuring each of the source electrode 532 and the drain electrode 542 can be appropriately adjusted. A material to be in ohmic contact with the nitride semiconductor layer is preferably used for such a conductive film.

Subsequently, an insulating film is formed over the interlayer insulating film 600 as well as over the source electrode 532 and over the drain electrode 542, and an interconnection may be further formed thereon. A protective film including an insulating film may also be formed over the top interconnection.

The semiconductor device of the first embodiment can be formed through the above-described steps. The steps are merely shown as an example, and the semiconductor device of the first embodiment may be manufactured through other steps.

For example, the gate insulating film 510 and the gate electrode 520 are first formed, and are used as a mask to partway etch the fourth nitride semiconductor layer 400 instead of using the protective film PRO1 as a mask to partway etch the fourth nitride semiconductor layer 400, thereby the overlap region between the gate electrode 520 and the side part (thin film part) SP can be reduced up to 0 (on the line) (La≤Lg<Lb).

Second Embodiment

Although the side part SP is configured by the thin film part 410 of the fourth nitride semiconductor layer (400) in the first embodiment, the side part SP may be configured by an ion-implanted part. To put it another way, although the 2DEG suppression effect of the side part SP is disabled by reducing the thickness of the fourth nitride semiconductor layer (400) in the first embodiment, the 2DEG suppression effect is disabled by disrupting crystallinity through ion implantation into the fourth nitride semiconductor layer (400) in a second embodiment.

Description of Structure

Figure 24:
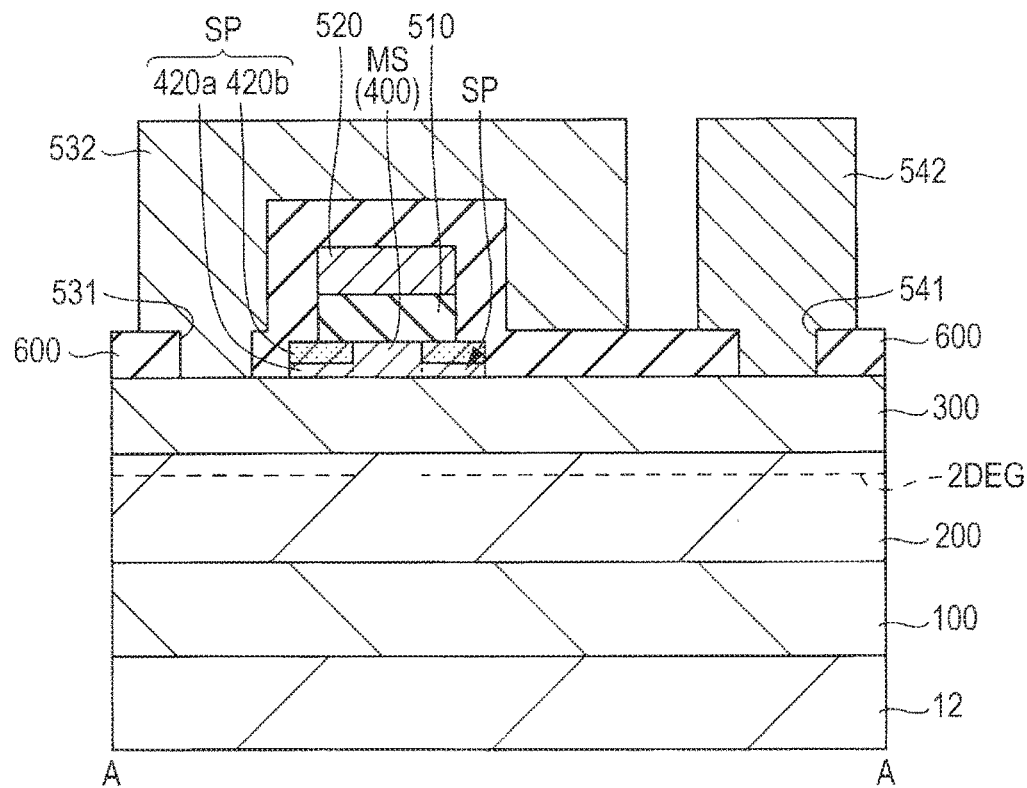
FIG. 24 is a sectional view illustrating a configuration of a semiconductor device of a second embodiment.
Figure 25:
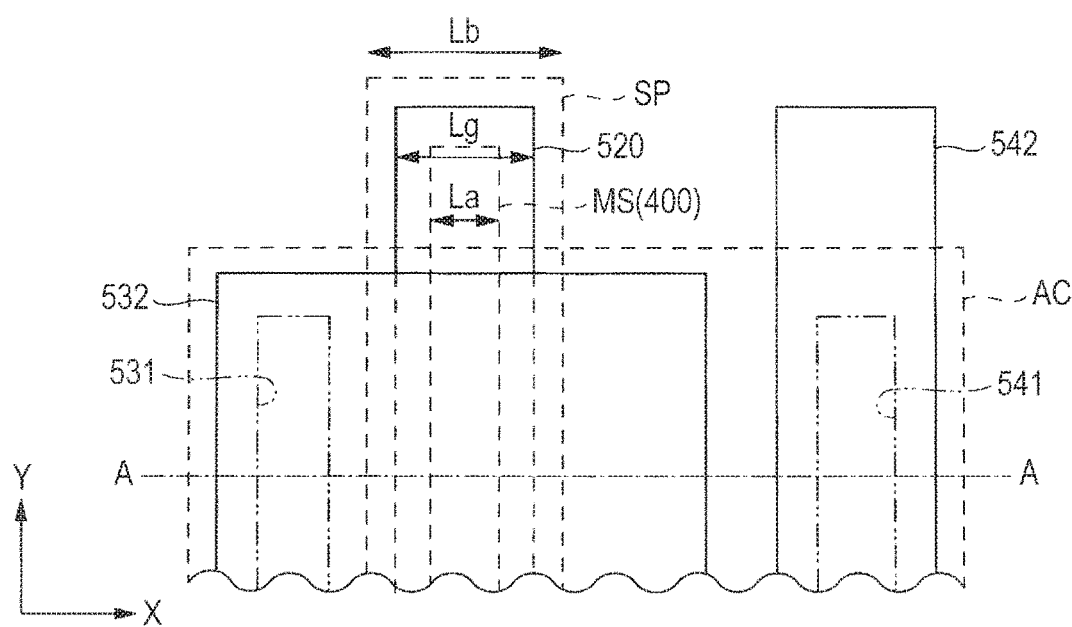
FIG. 25 is a plan view illustrating the configuration of the semiconductor device of the second embodiment.

FIG. 24 is a sectional view illustrating a configuration of the semiconductor device of the second embodiment. FIG. 25 is a plan view illustrating the configuration of the semiconductor device of the second embodiment. The sectional view of FIG. 24 corresponds to a portion A-A of FIG. 25, for example.

In the semiconductor device of the second embodiment, as shown in FIGS. 24 and 25, since any configuration other than the side part SP is the same as that of the semiconductor device of the first embodiment (FIGS. 1 and 2), duplicated description is omitted.

In the second embodiment, the side part SP includes an ion-implanted region (ion-implanted part, or doped layer) 420b and an undoped region (undoped layer) 420a located under the ion-implanted region 420b.

In the ion-implanted region 420b, an ion species such as boron (B) or nitrogen (N) is implanted by ion implantation or the like, so that crystallinity of the nitride semiconductor layer is disrupted. In the second embodiment, therefore, the mesa part MS and the side part SP have approximately the same thickness. The ion species, such as boron ions or nitrogen ions, in the ion-implanted region (doped layer) 420b can be identified by secondary ion mass spectroscopy (SIMS).

In this way, for example, ion implantation at low acceleration energy is performed onto both sides of the mesa part MS to disrupt crystallinity, making it possible to disable the 2DEG generation suppression ability. Specifically, crystallinity of the side part SP is selectively disrupted, thereby while an end portion of the fourth nitride semiconductor layer (the composite of the mesa part MS and the side part SP) 400 is separated from the gate electrode 520, the 2DEG generation region can be maintained up to an end of the gate electrode 520.

As described above, in the second embodiment, it can also be avoided that the current path (RT2) passing through the second channel is increased in resistance and thus on resistance is increased as described with reference to FIG. 5 in the first embodiment, and avoided that on resistance is increased due to formation of the offset structure as described with reference to FIG. 6. Specifically, in the second embodiment, the original current path (RT1) passing through the first channel becomes mainstream, and it is possible to reduce the leakage current at the end portion of the mesa part (2DEG suppression layer) MS, and maintain the generation region of 2DEG up to the end of the gate electrode 520, so that the leakage current and on resistance can be reduced together.

Description of Manufacturing Method

A method of manufacturing the semiconductor device of the second embodiment is now described with reference to FIGS. 26 to 31 while the configuration of the semiconductor device is further clarified. FIGS. 26 to 31 include sectional views and plan views illustrating a manufacturing process of the semiconductor device of the second embodiment. The same steps as those in the first embodiment are not described.

First, the substrate 12, on which the first to fourth nitride semiconductor layers (100 to 400) are formed in order, is provided (FIGS. 8 to 11).

Subsequently, as in the first embodiment, the protective film (for example, silicon oxide film about 10 nm thick) PRO1 is formed over the fourth nitride semiconductor layer (for example, about 60 nm thick) 400, and the photoresist film PR1 having an opening in the element isolation region ISO is formed over the protective film PRO1. Subsequently, boron ions are implanted through the protective film PRO1 with the photoresist film PR1 as a mask to form the element isolation region ISO (FIGS. 12 and 13).

Figure 26:
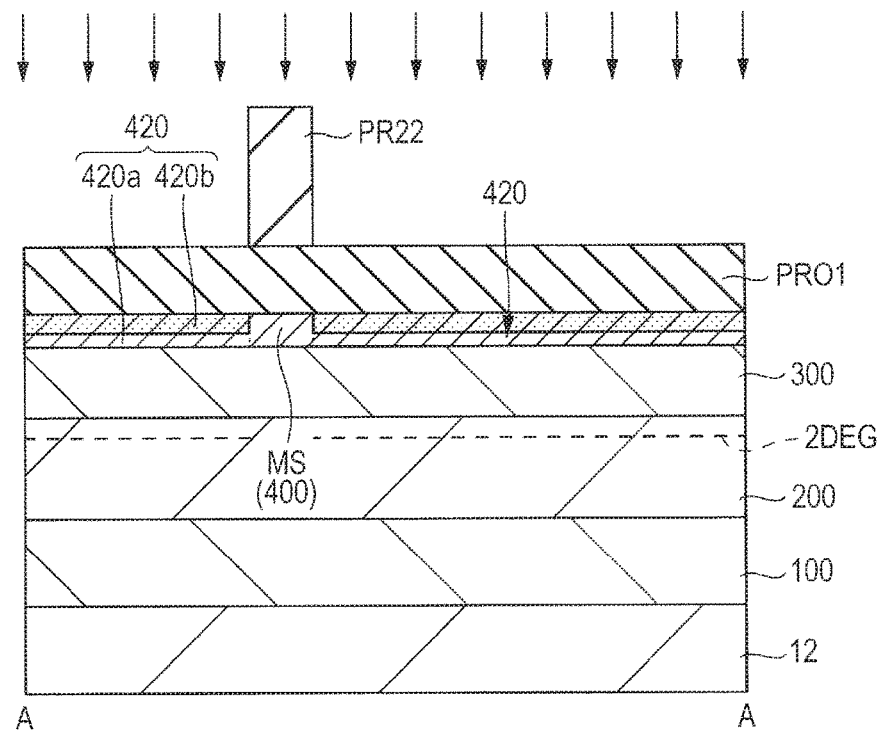
FIG. 26 is a sectional view illustrating a manufacturing process of the semiconductor device of the second embodiment.
Figure 27:
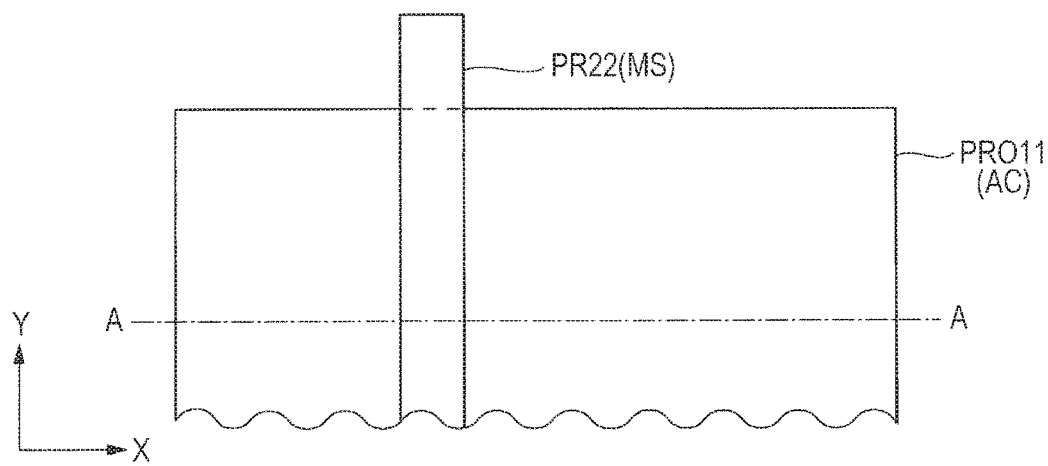
FIG. 27 is a plan view illustrating the manufacturing process of the semiconductor device of the second embodiment.

Subsequently, the photoresist film PR1 is removed, and then as shown in FIGS. 26 and 27, a photoresist film PR22 covering the mesa part formation region is formed over the protective film PRO1. The protective film PRO1 maybe removed to re-form another protective film.

Subsequently, boron ions are implanted through the protective film PRO1 with the photoresist film PR22 as a mask to form the doped layer 420b. The undoped layer 420a remains under the doped layer 420b.

The ion species such as boron (B) or nitrogen (N) is thus implanted, thereby crystallinity of the nitride semiconductor layer is disrupted, so that the crystallinity-reduced layer 420 (420a, 420b) is formed. The ion species implanted in this step is boron (B) or nitrogen (N), which is different from the ion species (for example, Si or Mg) implanted to form an n-type or p-type nitride semiconductor layer.

Specifically, for example, boron ions are implanted at a density of about $1 \times 10^{14}$ (1E14) cm$^{-2}$ into the fourth nitride semiconductor layer 400. The implantation energy is about 1 to 5 keV, for example. The implantation condition of the boron ions is adjusted such that the implantation depth is shallower than the bottom surface of the fourth nitride semiconductor layer 400. As a result, the mesa part MS including the undoped, fourth nitride semiconductor layer (400) is formed below the photoresist film PR22, and the crystallinity-reduced layer 420 is formed on both sides of the mesa part MS. As described above, the crystallinity-reduced layer 420 includes the upper doped layer 420b and the lower undoped layer 420a. Subsequently, the photoresist film PR22 is removed by plasma stripping processing or the like.

Figure 28:
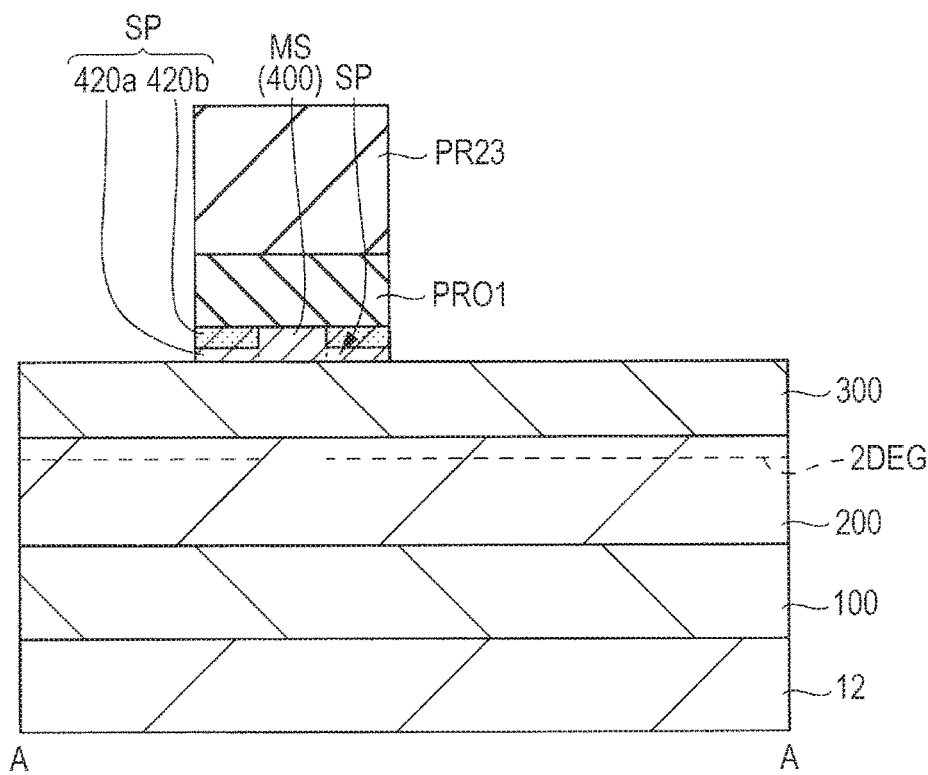
FIG. 28 is a sectional view illustrating the manufacturing process of the semiconductor device of the second embodiment.
Figure 29:
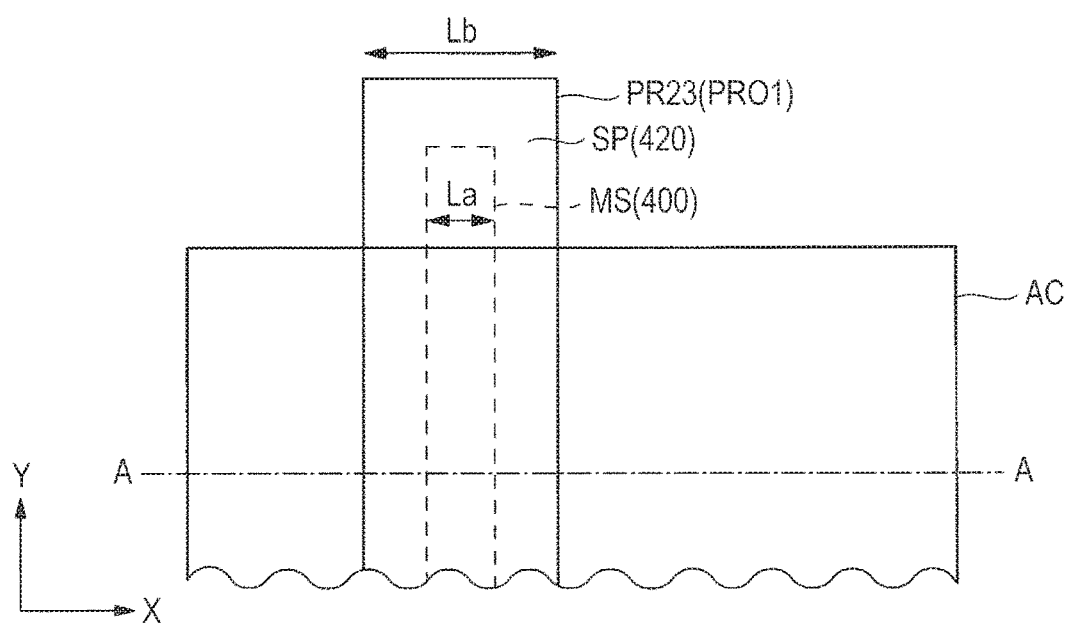
FIG. 29 is a plan view illustrating the manufacturing process of the semiconductor device of the second embodiment.

Subsequently, as shown in FIGS. 28 and 29, a photoresist film PR23 is formed over the protective film PRO1 by photolithography processing in a region (second rectangular shape in planar view) slightly larger than the formation region of the mesa part MS. The protective film PRO1 may be removed to re-form another protective film. The protective film PRO1 and the crystallinity-reduced layer 420 are etched with the photoresist film PR23 as a mask. As a result, the mesa part MS and the side part SP on both sides of the mesa part MS are formed. The side part SP includes the upper doped layer 420b and the lower undoped layer 420a. Subsequently, the photoresist film PR23 and the protective film PRO1 are removed in order by plasma stripping processing or the like.

Figure 30:
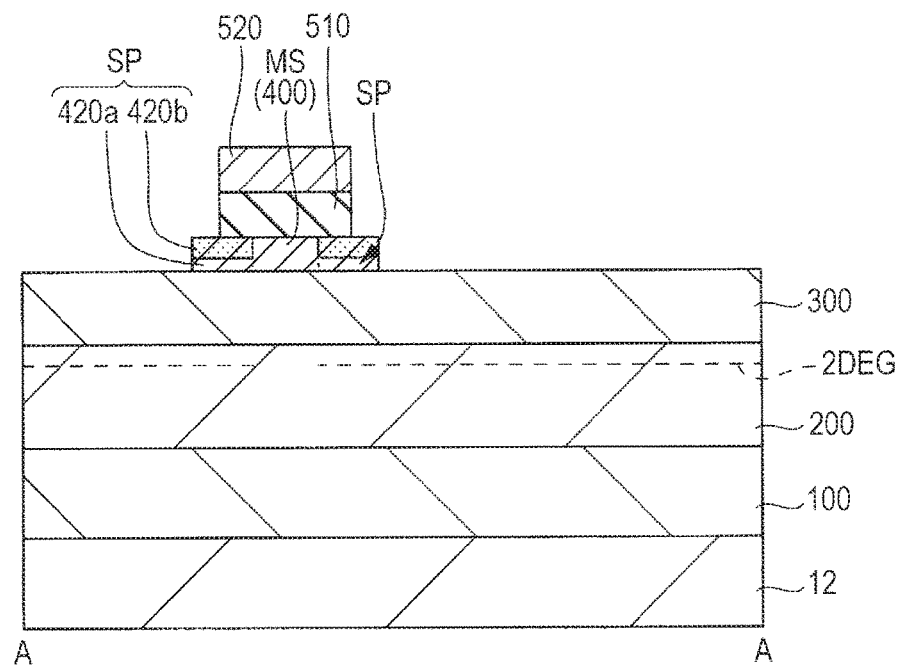
FIG. 30 is a sectional view illustrating the manufacturing process of the semiconductor device of the second embodiment.
Figure 31:
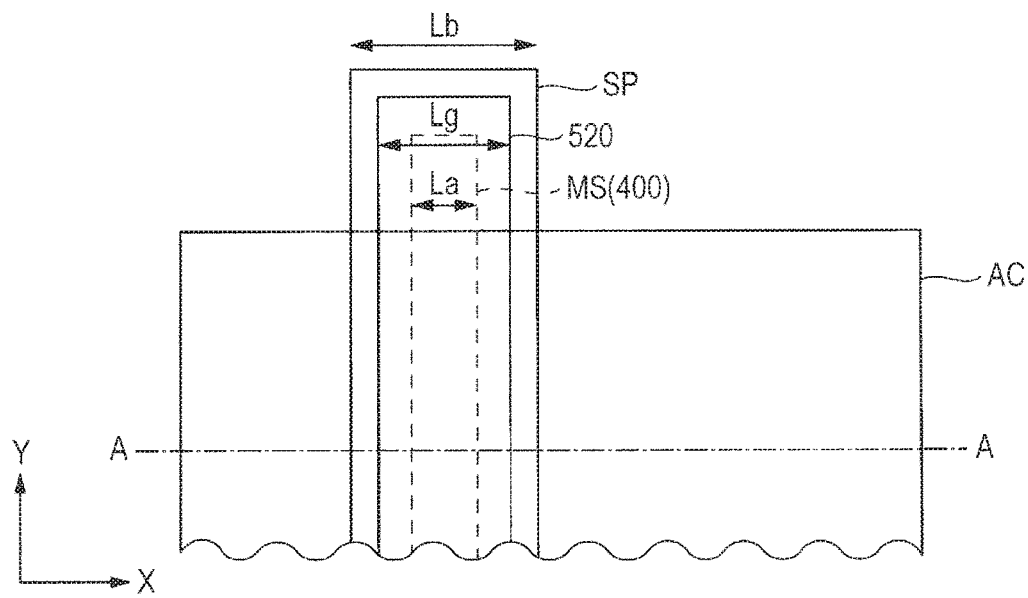
FIG. 31 is a plan view illustrating the manufacturing process of the semiconductor device of the second embodiment.

Subsequently, as shown in FIGS. 30 and 31, the gate insulating film 510 and the gate electrode 520 are formed over the mesa part MS and the side part SP on both sides of the mesa part MS. The gate insulating film 510 and the gate electrode 520 can each be formed of the same material and by the same method as in the first embodiment. Subsequently, the interlayer insulating film 600, the contact holes 531 and 541, the source electrode 532, and the drain electrode 542 are formed as in the first embodiment.

Subsequently, an insulating film is formed over the interlayer insulating film 600 as well as over the source electrode 532 and over the drain electrode 542, and an interconnection may be further formed thereon. A protective film including an insulating film may be formed over the top interconnection.

The semiconductor device of the second embodiment can be formed through the above-described steps. The steps are merely shown as an example, and the semiconductor device of the second embodiment may be manufactured through other steps.

For example, the gate insulating film 510 and the gate electrode 520 may be first formed so that the boron ions are then implanted into the fourth nitride semiconductor layer (400) through the gate insulating film 510 as a protective film with a photoresist film for patterning the gate electrode or the patterned gate electrode 520 as a mask instead of implanting the boron ions into the fourth nitride semiconductor layer (400) through the protective film PRO1 with the photoresist film PR22 as a mask. Consequently, the overlap region between the gate electrode 520 and the side part (thin film part) SP can be reduced up to 0 (on the line) (La≤Lg<Lb).

Third Embodiment

Although the 2DEG suppression effect is disabled through disrupting crystallinity by ion implantation into the fourth nitride semiconductor layer (400) in the second embodiment, the 2DEG suppression effect may be disabled through contact processing with an insulating film (silicon nitride film).

Description of Structure

Figure 32:
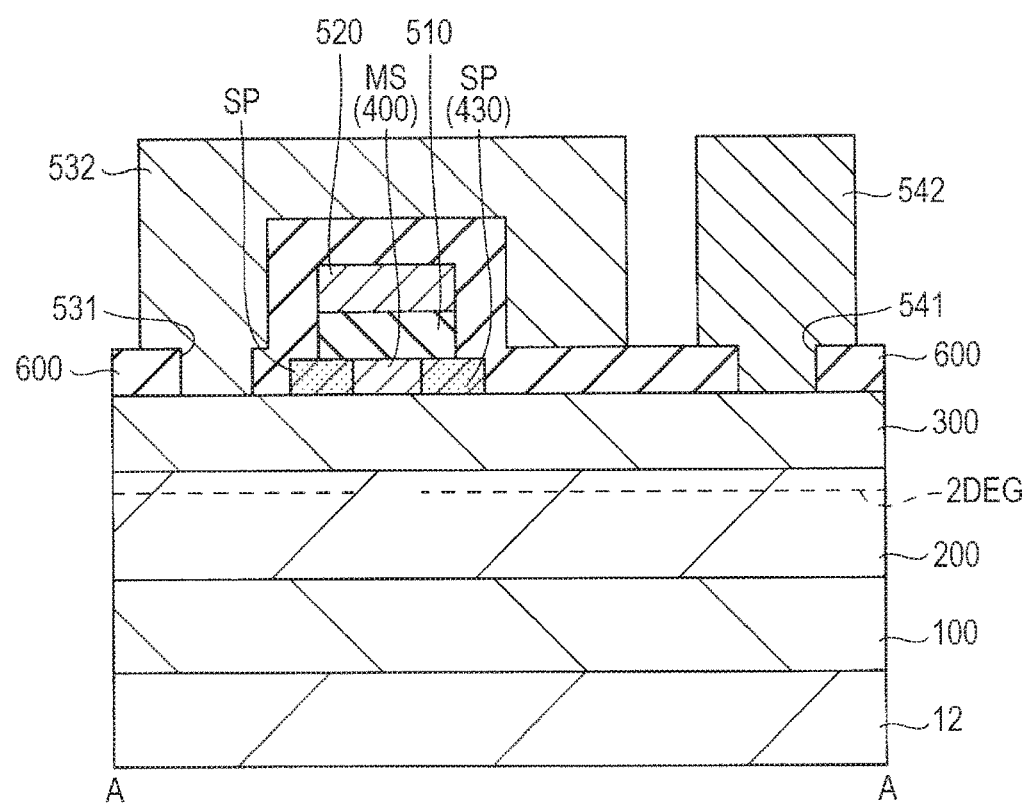
FIG. 32 is a sectional view illustrating a configuration of a semiconductor device of a third embodiment.
Figure 33:
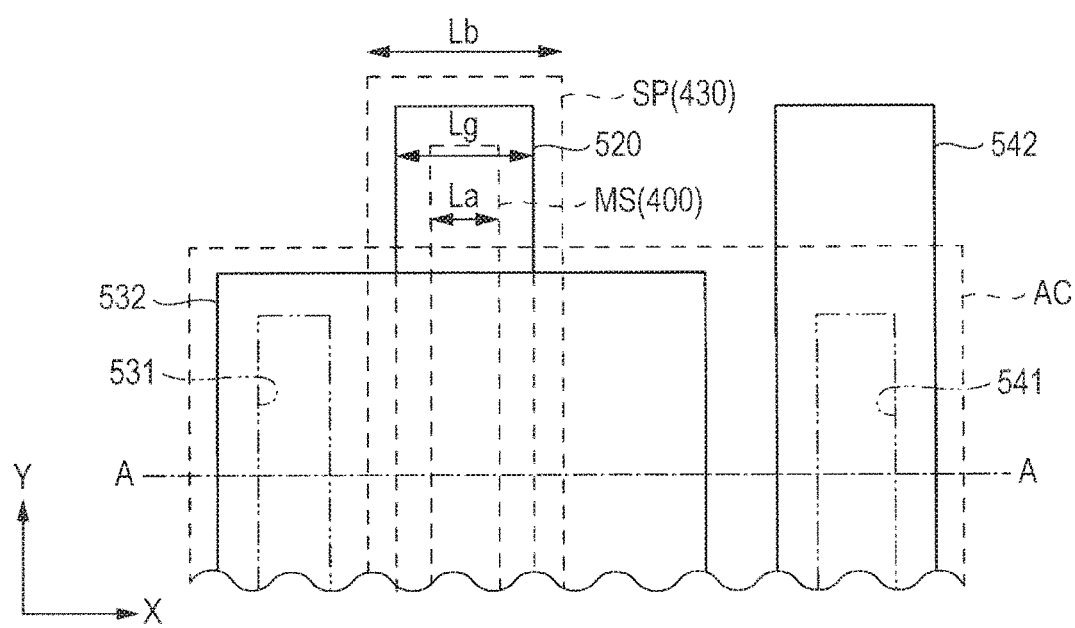
FIG. 33 is a plan view illustrating the configuration of the semiconductor device of the third embodiment.

FIG. 32 is a sectional view illustrating a configuration of a semiconductor device of a third embodiment. FIG. 33 is a plan view illustrating the configuration of the semiconductor device of the third embodiment. The sectional view of FIG. 32 corresponds to a portion A-A of FIG. 33, for example.

In the semiconductor device of the third embodiment, as shown in FIGS. 32 and 33, since any configuration other than the side part SP is the same as that of the semiconductor device of the first or second embodiment, duplicated description is omitted.

In the third embodiment, the side part SP includes a layer (430) subjected to contact processing with a silicon nitride (SiN) film. The inventors have found that the fourth nitride semiconductor layer (400) loses the 2DEG suppression effect through contact with the silicon nitride film. Although the cause of such loss of the 2DEG suppression effect has not been studied in detail, change in crystallinity of the fourth nitride semiconductor layer (400) due to contact with the silicon nitride film is considered to be involved. For example, as with the second embodiment, crystallinity is considered to be reduced in a region (contact portion) of the fourth nitride semiconductor layer (400) in contact with the silicon nitride (SiN) film. Hence, the layer subjected to contact processing with the silicon nitride (SiN) film is referred to as crystallinity-reduced layer 430 herein. The inventors have found that the 2DEG suppression effect of the fourth nitride semiconductor layer (400) through the contact processing with the silicon nitride film is not recovered by removing the silicon nitride film.

The side part SP may be formed using such a phenomenon. Specifically, the layer (crystallinity-reduced layer 430) subjected to contact processing with the silicon nitride (SiN) film may be used as the side part SP. In such a case, as with the first or second embodiment, it is possible to reduce the leakage current at the end portion of the mesa part (2DEG suppression layer) MS, and maintain the generation region of 2DEG up to the end of the gate electrode 520, so that the leakage current and on resistance can be reduced together.

Description of Manufacturing Method

A method of manufacturing the semiconductor device of the third embodiment is now described with reference to FIGS. 34 to 41 while the configuration of the semiconductor device is further clarified. FIGS. 34 to 41 include sectional views and plan views illustrating a manufacturing process of the semiconductor device of the third embodiment. The same steps as those in the first embodiment are not described.

First, the substrate 12, on which the first to fourth nitride semiconductor layers (100 to 400) are formed in order, is provided (FIGS. 8 to 11).

Subsequently, as in the first embodiment, the protective film (for example, silicon oxide film about 10 nm thick) PRO1 is formed over the fourth nitride semiconductor layer (for example, about 60 nm thick) 400, and the photoresist film PR1 is formed over the protective film PRO1 so as to have an opening in the element isolation region ISO. Subsequently, boron ions are implanted through the protective film PRO1 with the photoresist film PR1 as a mask to form the element isolation region ISO (FIGS. 12 and 13).

Figure 34:
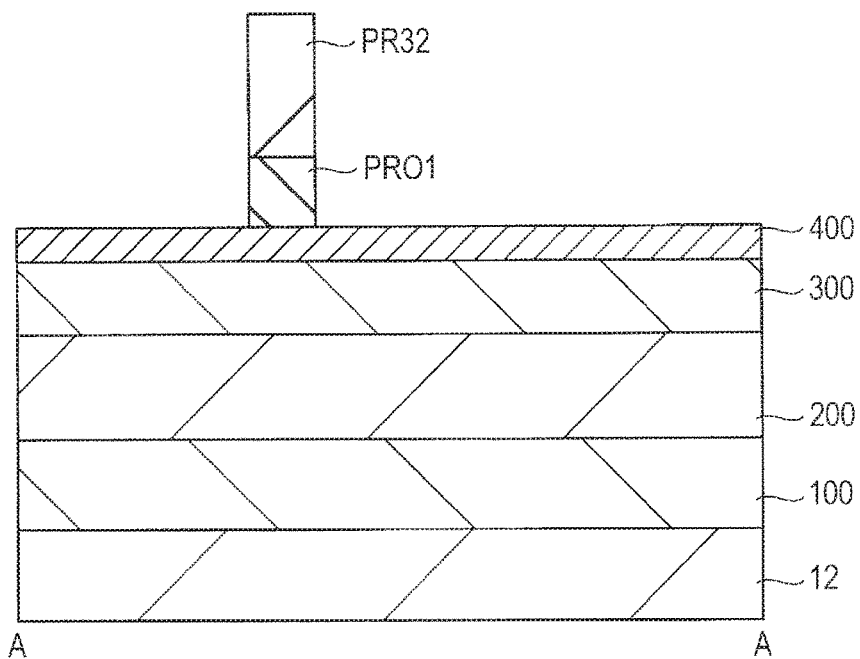
FIG. 34 is a sectional view illustrating a manufacturing process of the semiconductor device of the third embodiment.
Figure 35:
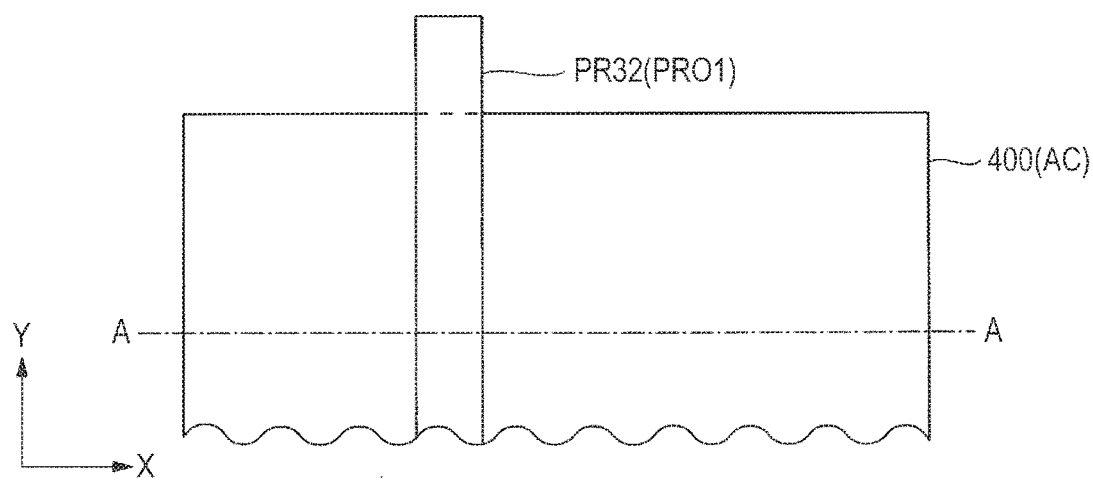
FIG. 35 is a plan view illustrating the manufacturing process of the semiconductor device of the third embodiment.

Subsequently, the photoresist film PR1 is removed, and then as shown in FIGS. 34 and 35, a photoresist film PR32 is formed over the protective film PRO1 so as to cover the mesa part formation region. The protective film PRO1 may be removed to re-form another protective film. Subsequently, the protective film PRO1 is etched with the photoresist film PR32 as a mask to leave the protective film PRO1 in the mesa part formation region. Subsequently, the photoresist film PR22 is removed by plasma stripping processing or the like.

Figure 36:
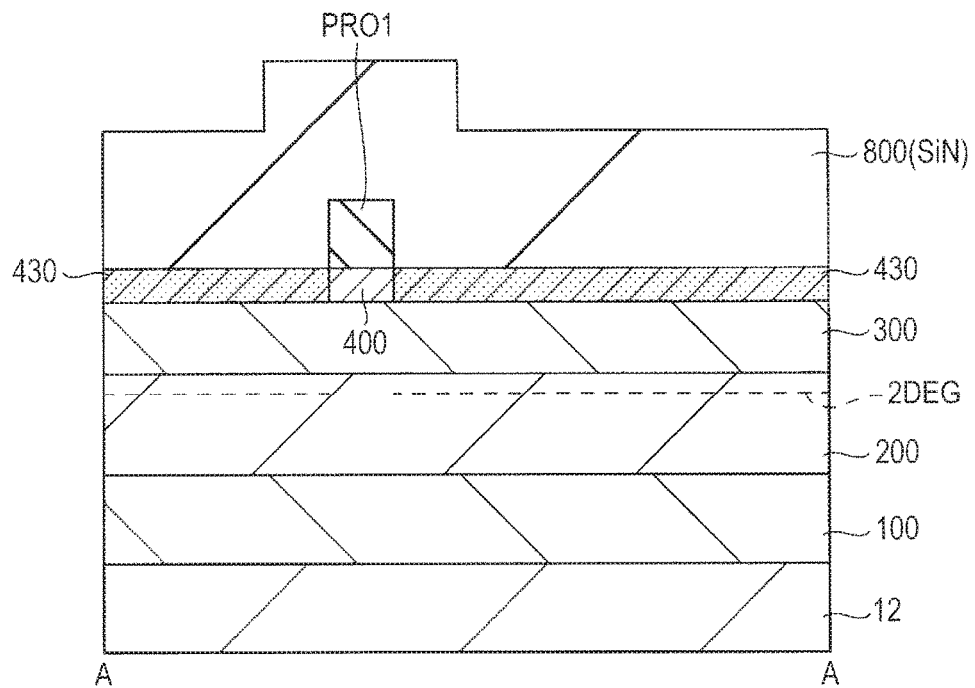
FIG. 36 is a sectional view illustrating the manufacturing process of the semiconductor device of the third embodiment.
Figure 37:
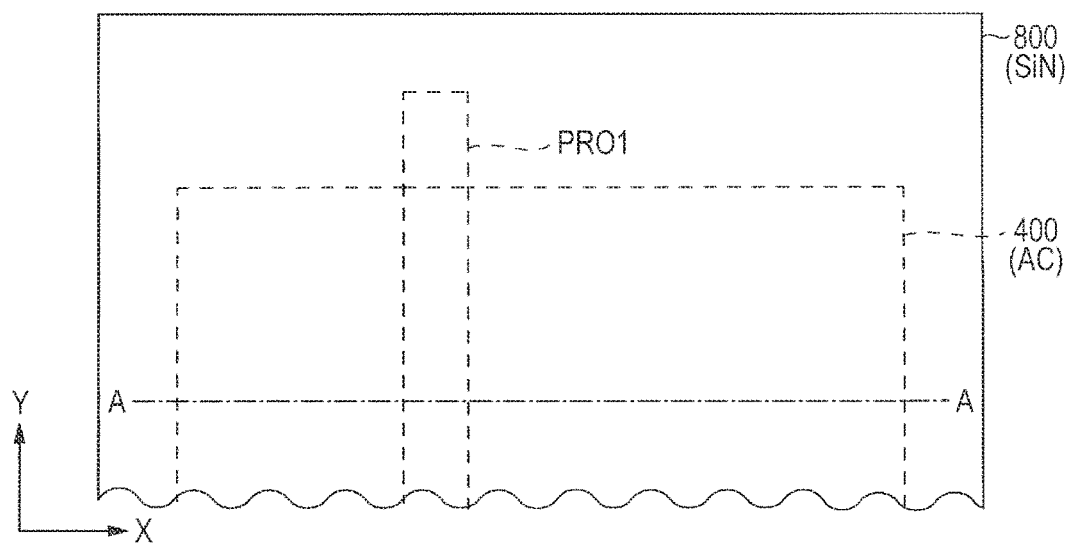
FIG. 37 is a plan view illustrating the manufacturing process of the semiconductor device of the third embodiment.

Subsequently, as shown in FIGS. 36 and 37, a silicon nitride (Si$_3$N$_4$) film 800 is deposited at a thickness of about 100 to 200 nm using a plasma CVD process or the like over the fourth nitride semiconductor layer (400) as well as over the protective film PRO1. As a result, the mesa part MS including the fourth nitride semiconductor layer (400), which is not in contact with the silicon nitride film 800, is formed below the protective film PRO1, and a layer (430), the crystallinity of which is reduced through contact with the silicon nitride film 800, is formed on both sides of the mesa part MS. That is, the 2DEG generation suppression function of the fourth nitride semiconductor layer 400 is lost through contact with the silicon nitride film 800, and thus 2DEG is generated in a contact area between the silicon nitride (Si$_3$N$_4$) film 800 and the fourth nitride semiconductor layer 400. Subsequently, the silicon nitride (Si$_3$N$_4$) film 800 and the protective film PRO1 are removed.

Figure 38:
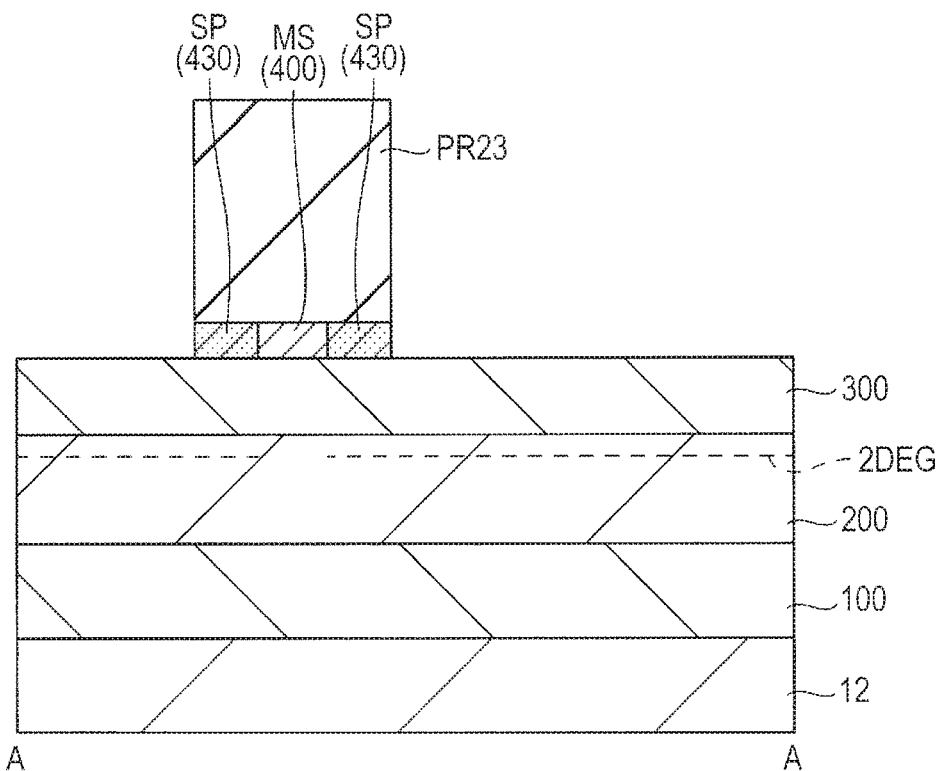
FIG. 38 is a sectional view illustrating the manufacturing process of the semiconductor device of the third embodiment.
Figure 39:
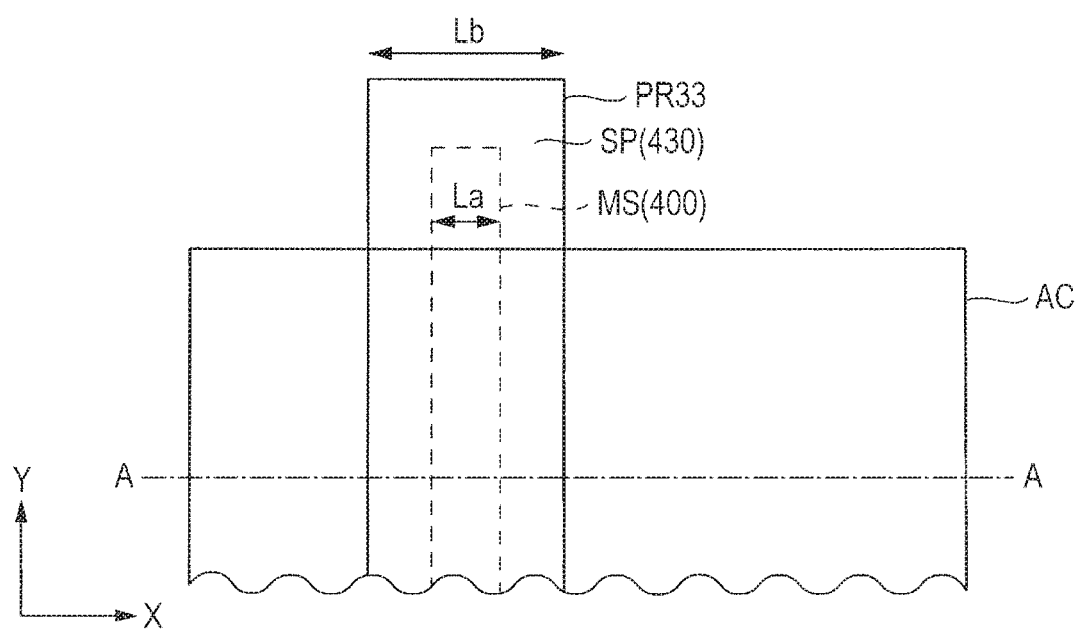
FIG. 39 is a plan view illustrating the manufacturing process of the semiconductor device of the third embodiment.

Subsequently, as shown in FIGS. 38 and 39, a photoresist film PR33 is formed by photolithography processing over the crystallinity-reduced layer 430, the mesa part MS, and the third nitride semiconductor layer (barrier layer) 300 in a region (second rectangular shape in planar view) slightly larger than the formation region of the mesa part MS. The side part SP is etched with the photoresist film PR33 as a mask. As a result, the mesa part MS and the side part SP, which is disposed on both sides of the mesa part MS and includes the crystallinity-reduced layer 430, are formed. Subsequently, the photoresist film PR33 is removed by plasma stripping processing or the like.

Figure 40:
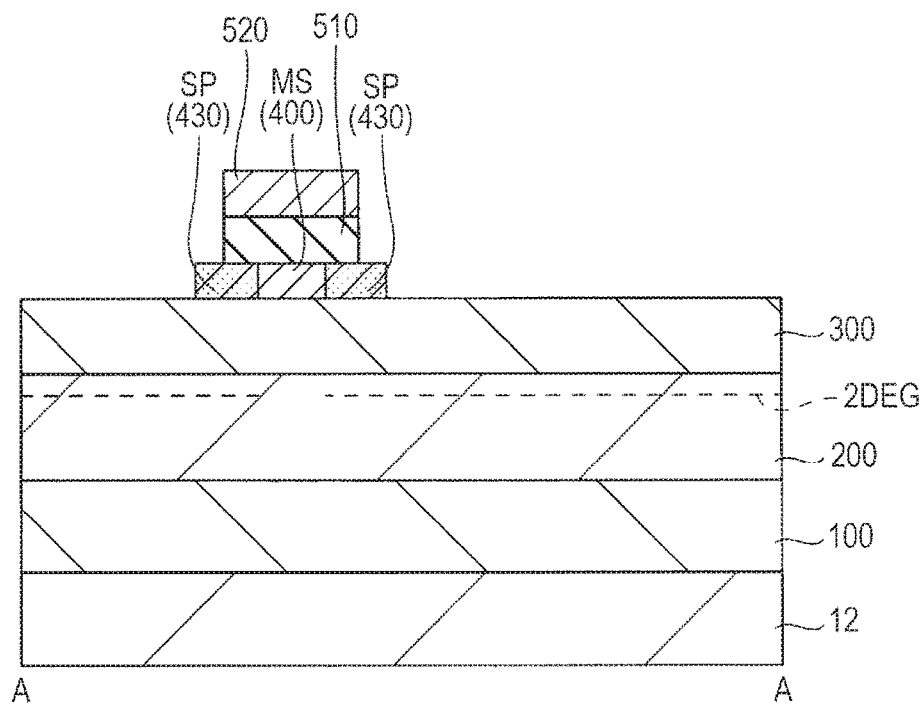
FIG. 40 is a sectional view illustrating the manufacturing process of the semiconductor device of the third embodiment.
Figure 41:
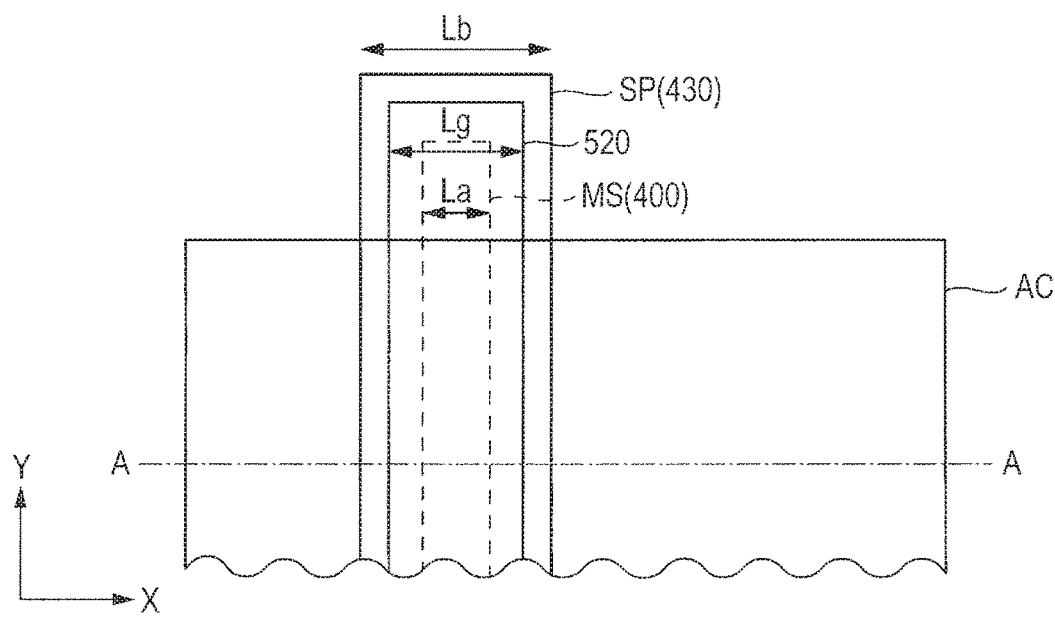
FIG. 41 is a plan view illustrating the manufacturing process of the semiconductor device of the third embodiment.

Subsequently, as shown in FIGS. 40 and 41, the gate insulating film 510 and the gate electrode 520 are formed over the mesa part MS and the side part SP on both sides of the mesa part MS. The gate insulating film 510 and the gate electrode 520 can each be formed of the same material and by the same method as in the first embodiment. Subsequently, the interlayer insulating film 600, the contact holes 531 and 541, the source electrode 532, and the drain electrode 542 are formed as in the first embodiment.

Subsequently, an insulating film is formed over the interlayer insulating film 600 as well as over the source electrode 532 and over the drain electrode 542, and an interconnection may be further formed thereon. A protective film including an insulating film may be formed over the top interconnection.

The semiconductor device of the third embodiment can be formed through the above-described steps. The steps are merely shown as an example, and the semiconductor device of the third embodiment may be manufactured through other steps.

In the third embodiment, as with the second embodiment, a crystalline portion (420*a*) may remain below a region (420*b*) having reduced crystallinity in the side part SP (see FIG. 24).

Fourth Embodiment

Although the semiconductor device of the second or third embodiment is configured such that the gate electrode 520 is disposed over the mesa part MS with the gate insulating film 510 in between, the semiconductor device may have a junction-type FET (JFET) configuration without the gate insulating film 510.

First Application

Figure 42:
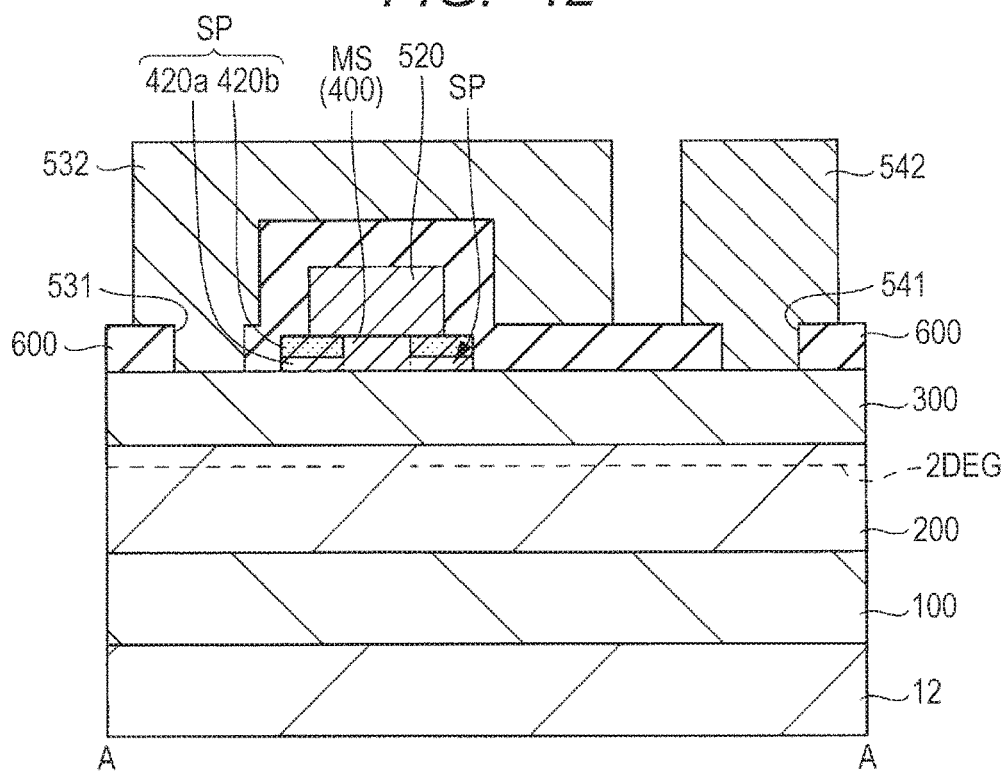
FIG. 42 is a sectional view illustrating a configuration of a semiconductor device of a first application of a fourth embodiment.

FIG. 42 is a sectional view illustrating a configuration of a semiconductor device of a first application of a fourth embodiment. The semiconductor device of the first application corresponds to a configuration of the semiconductor device of the second embodiment except that the gate insulating film 510 is not provided. As described above, since the semiconductor device of the first application is the same as the semiconductor device of the second embodiment except that the gate insulating film 510 is omitted, duplicated description is omitted. The semiconductor device of the first application can be manufactured by, for example, the manufacturing process described in the second embodiment except that the step of forming the gate insulating film 510 is not included.

Second Application

Figure 43:
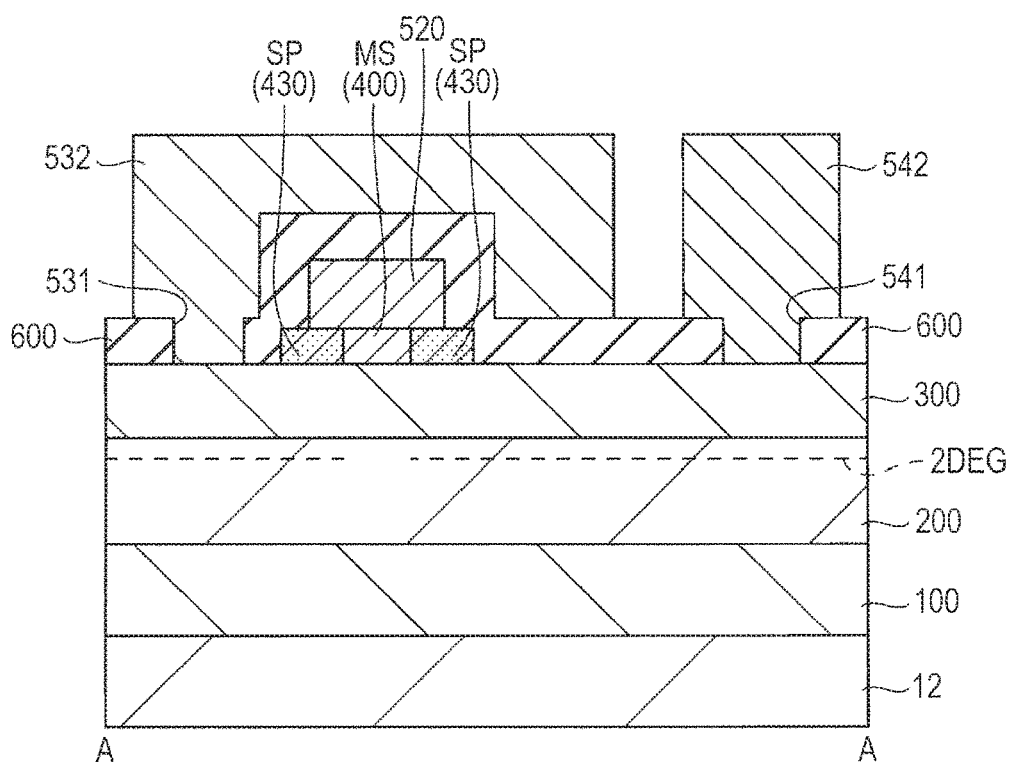
FIG. 43 is a sectional view illustrating a configuration of a semiconductor device of a second application of the fourth embodiment.

FIG. 43 is a sectional view illustrating a configuration of a semiconductor device of a second application of the fourth embodiment. The semiconductor device of the second application corresponds to a configuration of the semiconductor device of the third embodiment except that the gate insulating film 510 is not provided. As described above, since the semiconductor device of the second application is the same as the semiconductor device of the third embodiment except that the gate insulating film 510 is omitted, duplicated description is omitted. The semiconductor device of the second application can be manufactured by, for example, the manufacturing process described in the third embodiment except that the step of forming the gate insulating film 510 is not included.

In the semiconductor device (junction-type FET) of the fourth embodiment, it is also possible to reduce the leakage current at the end portion of the mesa part (2DEG suppression layer) MS, and maintain the generation region of 2DEG up to the end of the gate electrode 520, so that the leakage current and on resistance can be reduced together.

In the junction-type FET, however, thickness of the mesa part (2DEG suppression layer) MS must be carefully designed. Specifically, when an electric field of more than 1 MV/cm is applied to the mesa part MS, a tunneling current flows through the inside rather than along an end of the mesa part MS. In the junction-type FET, therefore, since the gate insulating film is not provided, the thickness of the mesa part MS is preferably set such that the electric field does not exceed the above-described 1 MV/cm. For example, when the rated gate voltage is 5 V and the thickness of the barrier layer is 10 nm, the thickness of the mesa part MS can be adjusted to about 75 nm. In such a case, the electric field strength is about 0.6 MV/cm, and no tunneling current is generated.

Fifth Embodiment

The semiconductor device of the first embodiment cannot be formed into a junction-type FET only by removing the gate insulating film 510. The following configuration is therefore preferred.

Description of Structure

Figure 44:
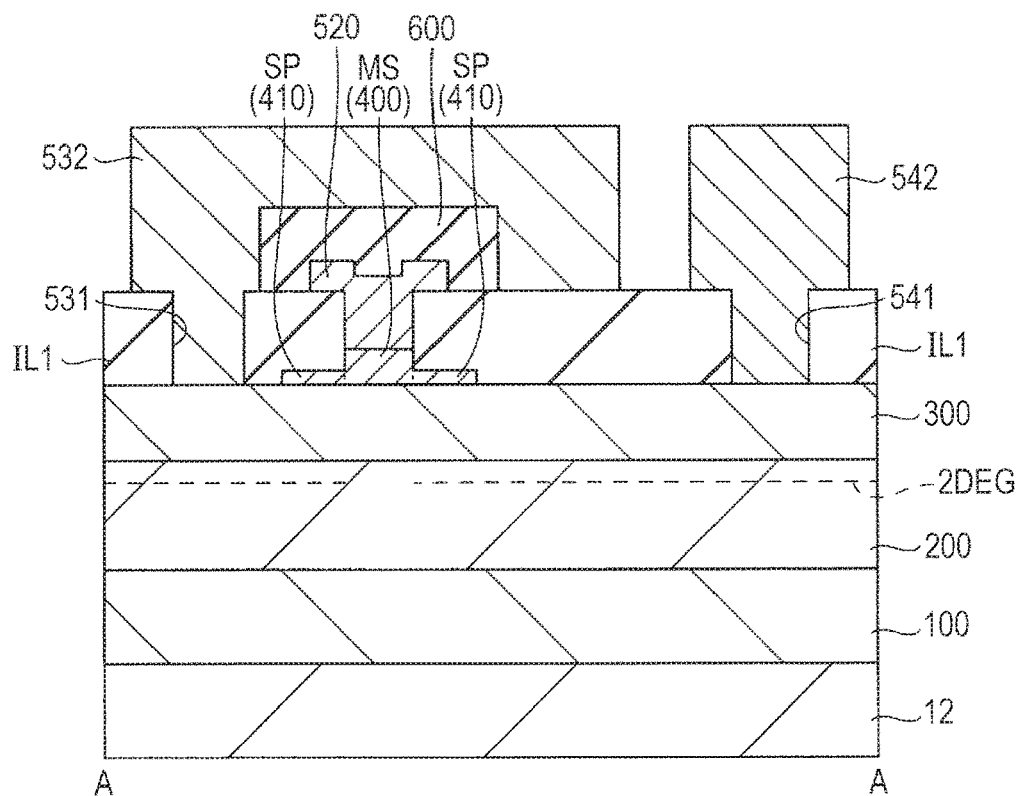
FIG. 44 is a sectional view illustrating a configuration of a semiconductor device of a fifth embodiment.
Figure 45:
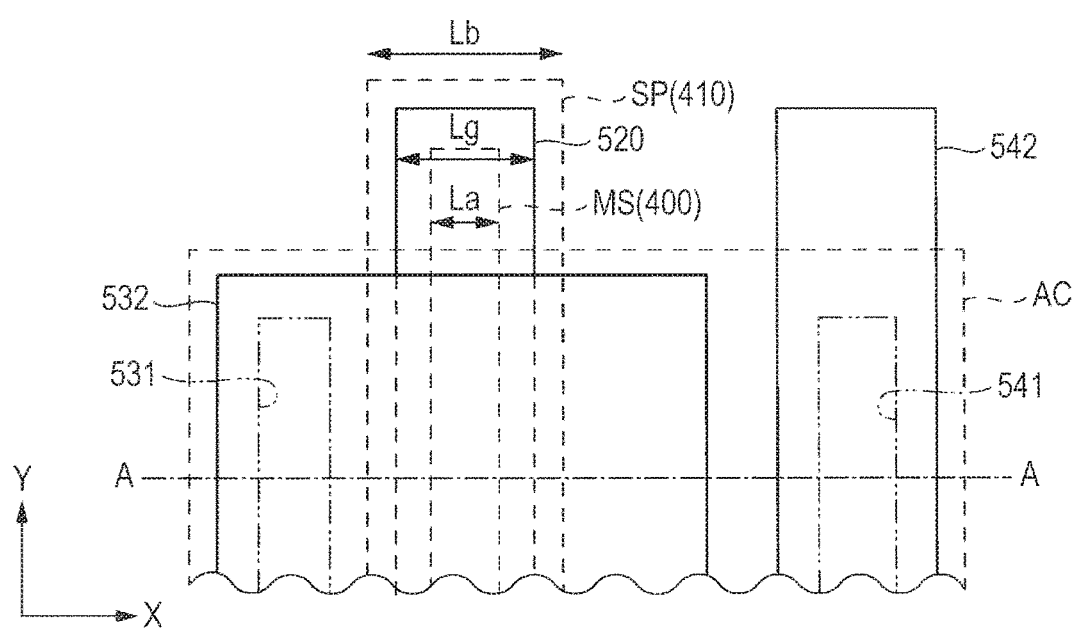
FIG. 45 is a plan view illustrating the configuration of the semiconductor device of the fifth embodiment.

FIG. 44 is a sectional view illustrating a configuration of a semiconductor device of a fifth embodiment. FIG. 45 is a plan view illustrating the configuration of the semiconductor device of the fifth embodiment. The sectional view of FIG. 44 corresponds to a portion A-A of FIG. 45, for example.

In the configuration of the semiconductor device of the fifth embodiment, as shown in FIGS. 44 and 45, an interlayer insulating film IL1 limits the contact area between the mesa part MS and the gate electrode 520 such that the side part SP is not in contact with the gate electrode 520. The gate insulating film is not provided. Other components are the same as those in the first embodiment.

In the semiconductor device (junction-type FET) of the fifth embodiment, it is also possible to reduce the leakage current at the end portion of the mesa part (2DEG suppression layer) MS, and maintain the generation region of 2DEG up to the end of the gate electrode 520, so that the leakage current and on resistance can be reduced together.

Description of Manufacturing Method

A method of manufacturing the semiconductor device of the fifth embodiment is now described with reference to FIGS. 46 to 55 while the configuration of the semiconductor device is further clarified. FIGS. 46 to 55 include sectional views and plan views illustrating a manufacturing process of the semiconductor device of the fifth embodiment. The same steps as those in the first embodiment are not described.

First, the substrate 12, on which the first to fourth nitride semiconductor layers (100 to 400) are formed in order, is provided (FIGS. 8 to 11).

Subsequently, as in the first embodiment, the protective film (for example, silicon oxide film about 200 nm thick) PRO1 is formed over the fourth nitride semiconductor layer (for example, about 60 nm thick) 400, and the photoresist film PR1 having an opening in the element isolation region ISO is formed over the protective film PRO1. Subsequently, boron ions are implanted through the protective film PRO1 with the photoresist film PR1 as a mask to form the element isolation region ISO (FIGS. 12 and 13).

Subsequently, the photoresist film PR1 is removed, and then as with the first embodiment, the photoresist film PR2 is formed by photolithography processing in the formation region (first rectangular shape in planar view) of the mesa part MS on the protective film PRO1. The photoresist film PR2 is used as a mask so that the protective film PRO1 is etched and the underlying fourth nitride semiconductor layer 400 is partway etched. As a result, the mesa part MS and the thin film part 410 on both sides of the mesa part MS are formed. Subsequently, the photoresist film PR2 is removed by plasma stripping processing or the like (FIGS. 14 and 15).

Figure 46:
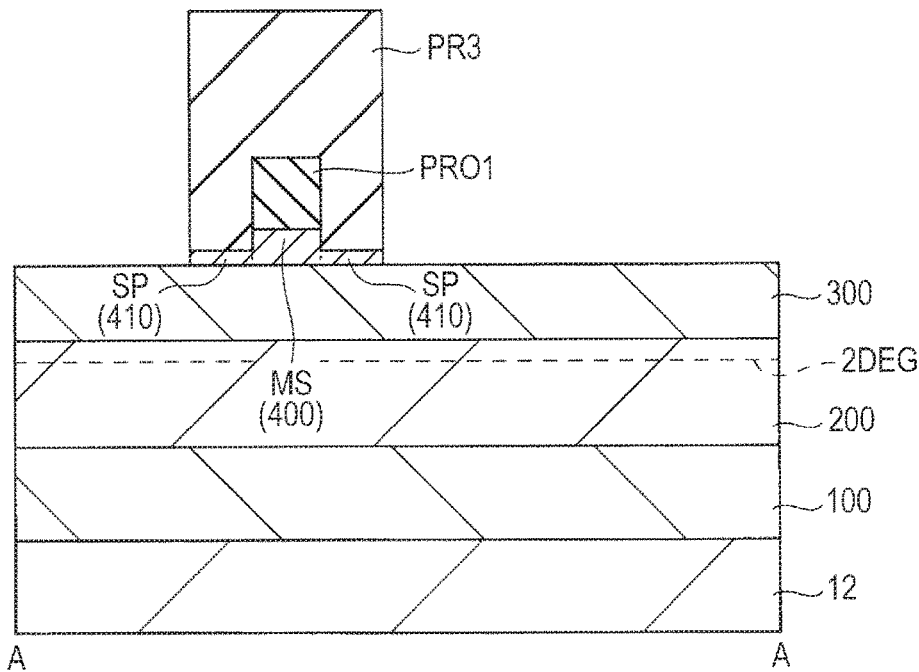
FIG. 46 is a sectional view illustrating a manufacturing process of the semiconductor device of the fifth embodiment.
Figure 47:
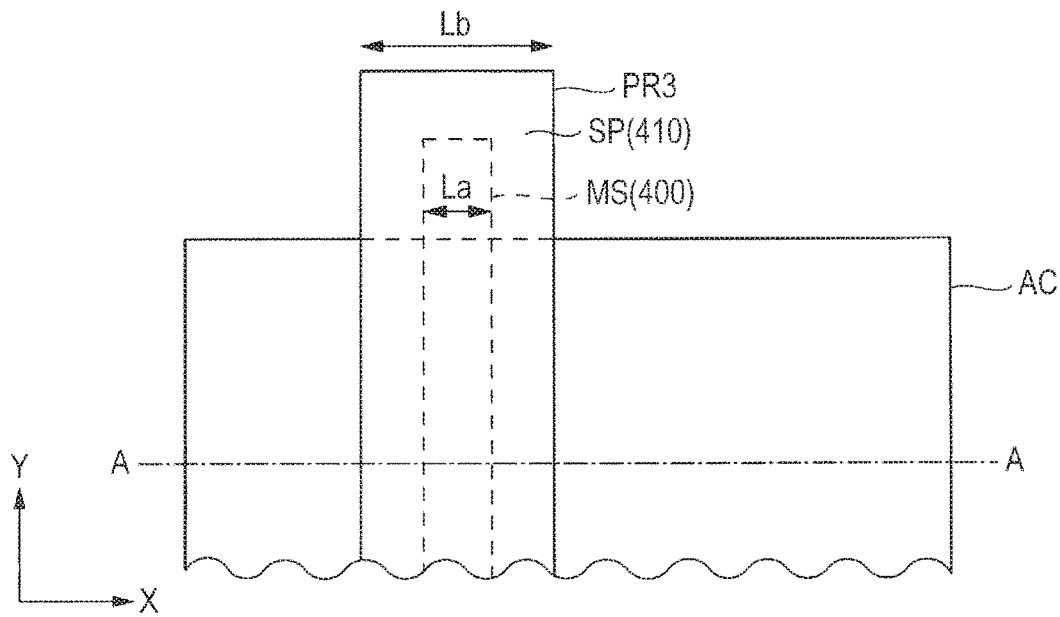
FIG. 47 is a plan view illustrating the manufacturing process of the semiconductor device of the fifth embodiment.

Subsequently, as shown in FIGS. 46 and 47, the photoresist film PR3 is formed over the protective film PRO1, the mesa part 410, and the thin film part 410 in a region (second rectangular shape in planar view) slightly larger than the formation region of the mesa part MS. The thin film part 410 of the fourth nitride semiconductor layer 400 is etched with the photoresist film PR3 as a mask. Subsequently, the photoresist film PR3 is removed. The protective film PRO1 may be removed to re-form another protective film.

Figure 48:
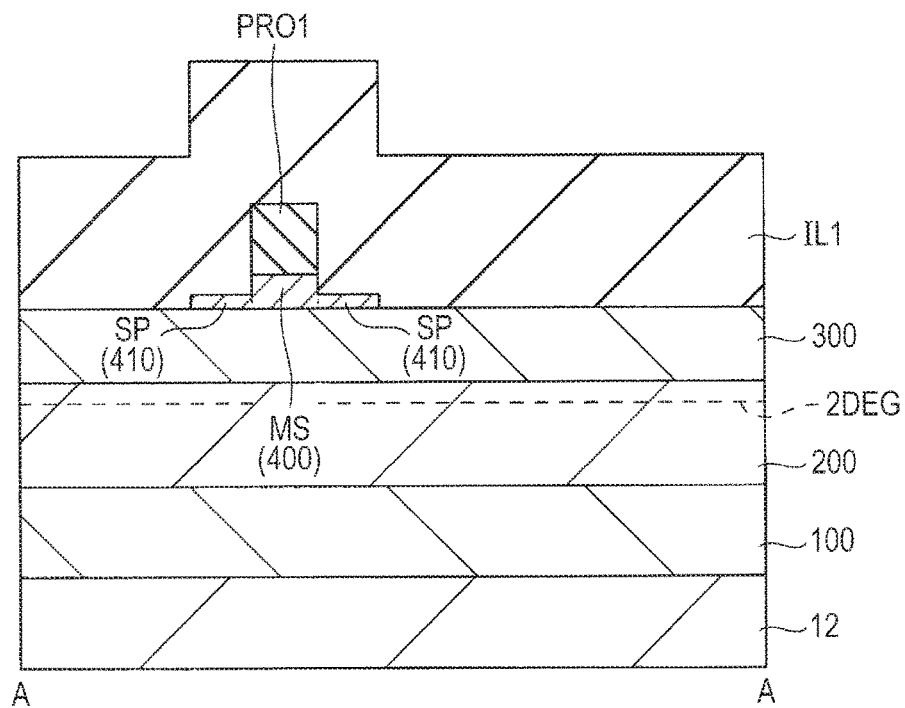
FIG. 48 is a sectional view illustrating the manufacturing process of the semiconductor device of the fifth embodiment.
Figure 49:
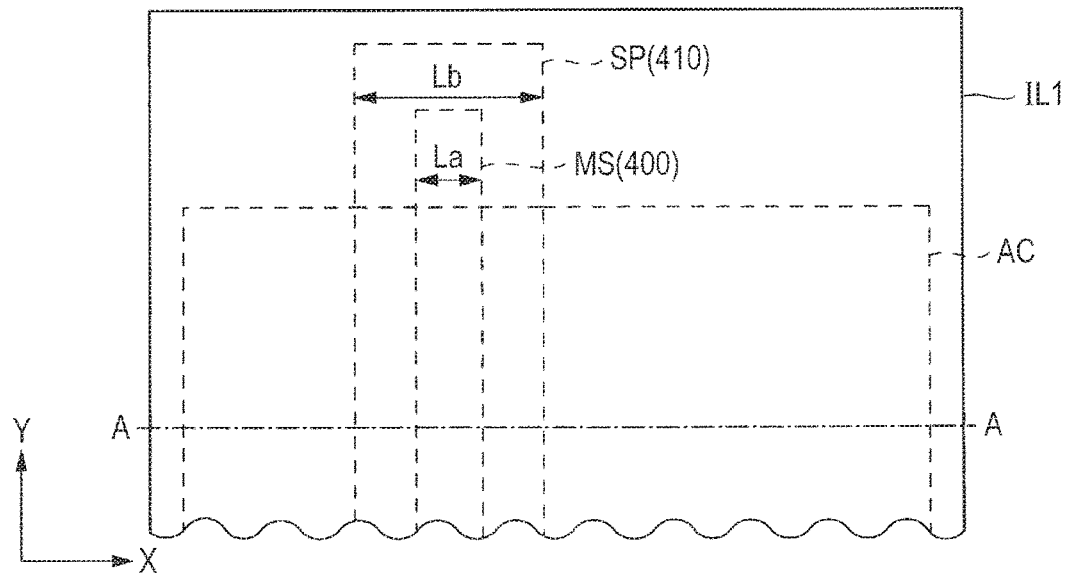
FIG. 49 is a plan view illustrating the manufacturing process of the semiconductor device of the fifth embodiment.

Subsequently, as shown in FIGS. 48 and 49, a second insulating film (for example, an SiON film about 200 nm thick) is formed as the interlayer insulating film IL1 over the third nitride semiconductor layer (barrier layer) 300 as well as over the side part SP and over the protective film PRO1. The second insulating film is preferably lower in etching rate (less etched) than the first insulating film under a predetermined etching condition.

Figure 50:
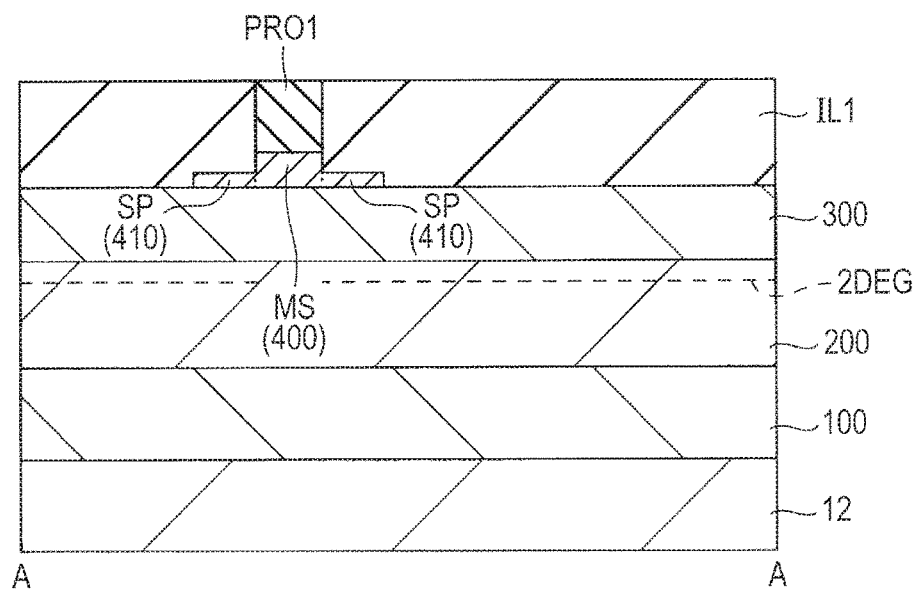
FIG. 50 is a sectional view illustrating the manufacturing process of the semiconductor device of the fifth embodiment.
Figure 51:
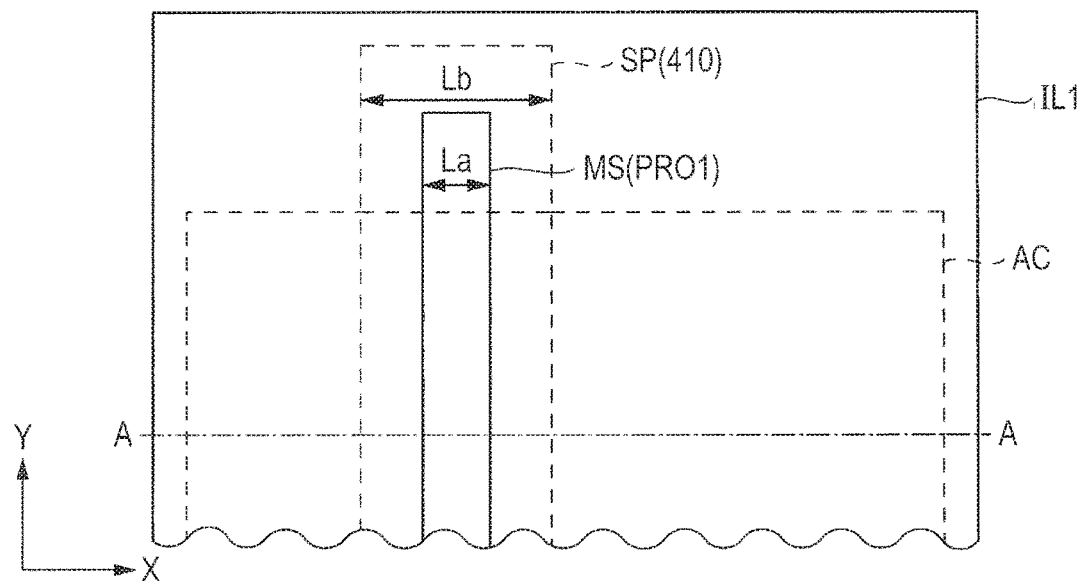
FIG. 51 is a plan view illustrating the manufacturing process of the semiconductor device of the fifth embodiment.

Subsequently, as shown in FIGS. 50 and 51, an upper part of the interlayer insulating film IL1 is removed by etchback or chemical mechanical polishing (CMP) until the surface of the protective film PRO1 is exposed.

Figure 52:
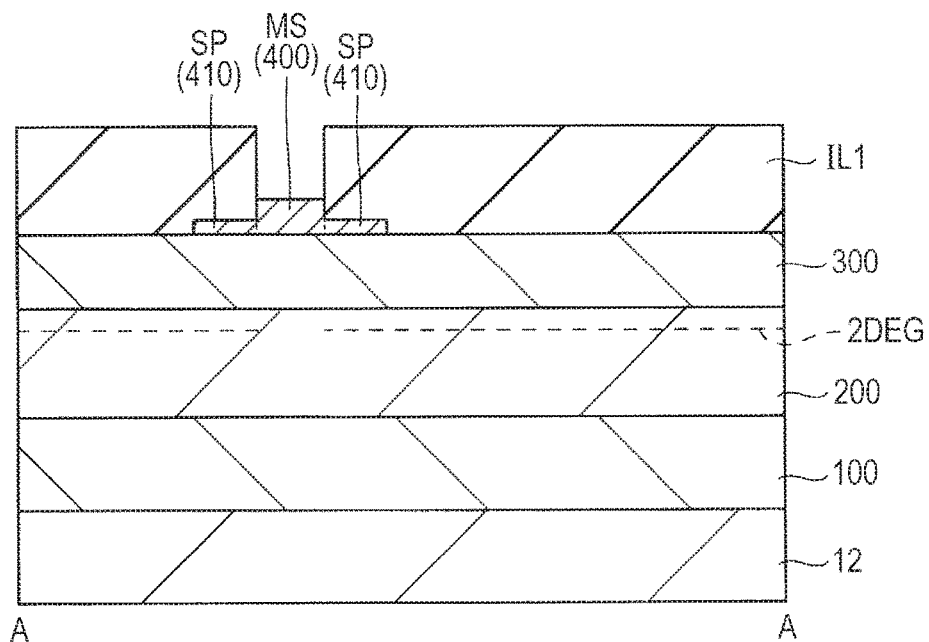
FIG. 52 is a sectional view illustrating the manufacturing process of the semiconductor device of the fifth embodiment.
Figure 53:
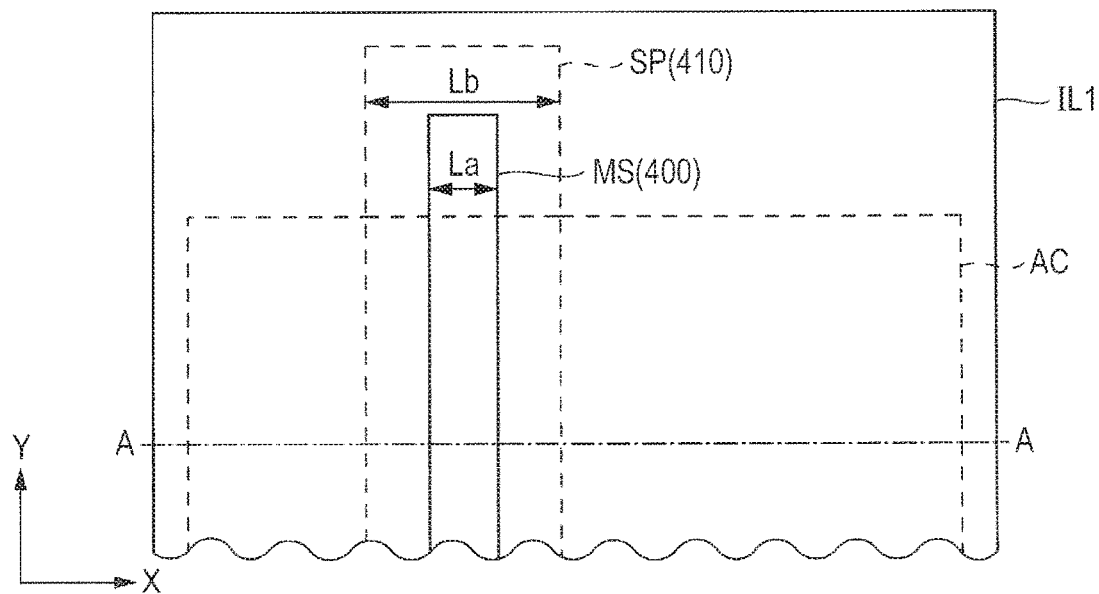
FIG. 53 is a plan view illustrating the manufacturing process of the semiconductor device of the fifth embodiment.

Subsequently, as shown in FIGS. 52 and 53, the exposed protective film PRO1 is removed by etching. As a result, a trench is formed on the mesa part MS.

Figure 54:
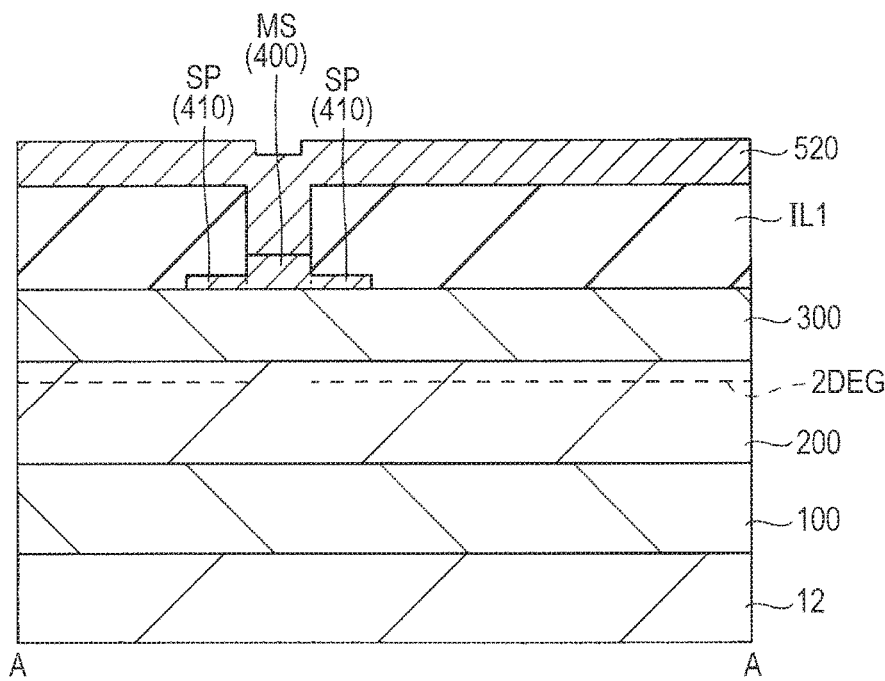
FIG. 54 is a sectional view illustrating the manufacturing process of the semiconductor device of the fifth embodiment.
Figure 55:
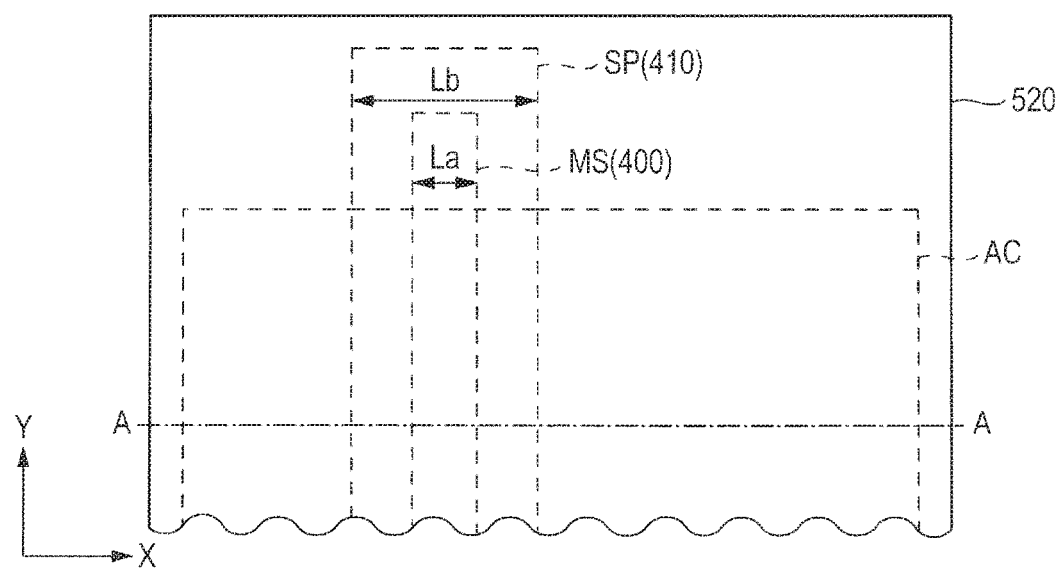
FIG. 55 is a plan view illustrating the manufacturing process of the semiconductor device of the fifth embodiment.

Subsequently, as shown in FIGS. 54 and 55, for example, a titanium nitride (TiN) film is deposited as a conductive film for the gate electrode 520 at a thickness of about 100 to 200 nm using a sputtering process or the like over the interlayer insulating film IL1 including the inside of the trench.

Subsequently, the conductive film (TiN) is patterned to form the gate electrode 520. In addition, the interlayer insulating film 600, the contact holes 531 and 541, the source electrode 532, and the drain electrode 542 are formed (FIGS. 44 and 45). Such components can be formed in steps similar to those in the first embodiment.

Subsequently, an insulating film is formed over the interlayer insulating film 600 as well as over the source electrode 532 and over the drain electrode 542, and an interconnection may be further formed thereon. A protective film including an insulating film may be formed over the top interconnection.

The semiconductor device of the fifth embodiment can be formed through the above-described steps. The steps are merely shown as an example, and the semiconductor device of the fifth embodiment may be manufactured through other steps.

Although the invention achieved by the inventors has been described in detail according to some embodiments thereof hereinbefore, the invention should not be limited thereto, and it will be appreciated that various modifications or alterations thereof may be made within the scope without departing from the gist of the invention. For example, although the side part is formed with the protective film or the photoresist film as a mask in the first to third embodiments, the gate electrode may be used as a mask. For example, the gate electrode may be patterned so that the fourth nitride semiconductor layer is then etched using the gate electrode as a mask to form the thin film part (410). In addition, the crystallinity-reduced layer (420, 430) may be formed with the gate electrode as a mask.

[Supplementary Note 1]

A method of manufacturing a semiconductor device, includes the steps of:

(a) forming a second nitride semiconductor layer over a first nitride semiconductor layer;

(b) forming a third nitride semiconductor layer over the second nitride semiconductor layer;

(c) forming a fourth nitride semiconductor layer over the third nitride semiconductor layer;

(d) forming a mesa part including the fourth nitride semiconductor layer, and forming a side part including the fourth nitride semiconductor layer and provided on both sides of the mesa part; and (e) forming a gate electrode above the mesa part, where the step (d) includes, after the step (e), forming the side part by etching the fourth nitride semiconductor layer with the gate electrode as a mask and forming the mesa part including the fourth nitride semiconductor layer below the gate electrode, and generation of two-dimensional electron gas between the second nitride semiconductor layer and the third nitride semiconductor layer is suppressed below the mesa part while being unsuppressed below the side part.

[Supplementary Note 2]

A method of manufacturing a semiconductor device, includes the steps of:

(a) forming a second nitride semiconductor layer over a first nitride semiconductor layer;

(b) forming a third nitride semiconductor layer over the second nitride semiconductor layer;

(c) forming a fourth nitride semiconductor layer over the third nitride semiconductor layer;

(d) forming a mesa part including the fourth nitride semiconductor layer, and forming a side part including the fourth nitride semiconductor layer and provided on both sides of the mesa part; and (e) forming a gate electrode above the mesa part, in which the step (d) includes the steps of:

(d1) forming the mesa part by partway etching a region of the fourth nitride semiconductor layer other than a region in which the mesa part is to be formed;

(d2) forming a second insulating film over the fourth nitride semiconductor layer as well as over a first insulating film over the mesa part, and then removing a surface of the second insulating film until the first insulating film is exposed; and (d3) forming a trench over the mesa part by removing the first insulating film, where the step (e) is a step of forming the gate electrode in the trench, the side part extends to the outside of the gate electrode, and generation of two-dimensional electron gas between the second nitride semiconductor layer and the third nitride semiconductor layer is suppressed below the mesa part while being unsuppressed below the side part.

What is claimed is:

1. A semiconductor device, comprising:
a first nitride semiconductor layer;
a second nitride semiconductor layer formed over the first nitride semiconductor layer;
a third nitride semiconductor layer formed over the second nitride semiconductor layer;
a mesa part formed over the third nitride semiconductor layer and including a fourth nitride semiconductor layer;
a source electrode formed over the third nitride semiconductor layer and on a first side of the mesa part;
a drain electrode formed over the third nitride semiconductor layer and on a second side of the mesa part;
a gate electrode formed above the mesa part; and
a side part formed on at least one side of the mesa part and including the fourth nitride semiconductor layer,
wherein the gate electrode is formed above a first a portion of the side part,
wherein a second portion of the side part extends to the outside of the gate electrode, and
wherein generation of two-dimensional electron gas between the second nitride semiconductor layer and the third nitride semiconductor layer is suppressed below the mesa part while being unsuppressed below the side part.

2. The semiconductor device according to claim 1, wherein the mesa part includes the fourth nitride semiconductor layer being undoped.

3. The semiconductor device according to claim 2, wherein the fourth nitride semiconductor layer includes a first thickness part, and a second thickness part disposed on both sides of the first thickness part and having a smaller thickness than the first thickness part, and
wherein the mesa part includes the first thickness part, and the side part includes the second thickness part.

4. The semiconductor device according to claim 2, wherein the fourth nitride semiconductor layer includes a first part, and a second part disposed on both sides of the first part and implanted with ions, and
wherein the mesa part includes the first part, and the side part includes the second part.

5. The semiconductor device according to claim 4, wherein the second part includes a doped layer implanted with the ions, and an undoped layer under the doped layer.

6. The semiconductor device according to claim 4, wherein the ions are ions of one of boron and nitrogen.

7. The semiconductor device according to claim 2, wherein the side part includes a layer subjected to contact processing with an insulating film.

8. The semiconductor device according to claim 7, wherein the insulating film is a nitride film.

9. The semiconductor device according to claim 2, wherein an end portion of the gate electrode is located over the side part.

10. The semiconductor device according to claim 2, further comprising a gate insulating film between the mesa part and the gate electrode.

11. A method of manufacturing a semiconductor device, comprising the steps of:

(a) forming a second nitride semiconductor layer over a first nitride semiconductor layer;

(b) forming a third nitride semiconductor layer over the second nitride semiconductor layer;

(c) forming a fourth nitride semiconductor layer over the third nitride semiconductor layer;

(d) forming a mesa part including the fourth nitride semiconductor layer, and forming a side part including the fourth nitride semiconductor layer and provided on both sides of the mesa part; and (e) forming a gate electrode above the mesa part and a first portion of the side part, wherein a second portion of the side part extends to the outside of the gate electrode, and wherein generation of two-dimensional electron gas between the second nitride semiconductor layer and the third nitride semiconductor layer is suppressed below the mesa part while being unsuppressed below the side part.

12. The method according to claim 11, wherein the step (d) is a step of providing the mesa part, and providing the side part having a smaller thickness than the mesa part on both sides of the mesa part.

13. The method according to claim 11, wherein the step (d) includes the steps of:
   (d1) forming a first mask film over a region of the fourth nitride semiconductor layer in which the mesa part is to be formed, and forming the side part by implanting ions with the first mask film as a mask; and
   (d2) removing the first mask film, forming a second mask film larger than the region in which the first mask film has been formed over the fourth nitride semiconductor layer, and etching the fourth nitride semiconductor layer with the second mask film as a mask.

14. The method according to claim 13, wherein the side part includes a doped layer implanted with the ions, and an undoped layer under the doped layer.

15. The method according to claim 13, wherein the ions are ions of one of boron and nitrogen.

16. The method according to claim 11, wherein the step (d) includes the steps of:
   (d1) forming a first insulating film over a region of the fourth nitride semiconductor layer in which the mesa part is to be formed, and forming a second insulating film over the fourth nitride semiconductor layer as well as over the first insulating film, thereby forming a side part having a contact portion between the fourth nitride semiconductor layer and the second insulating film; and
   (d2) forming a mask film over the fourth nitride semiconductor layer, the mask film being larger than the region in which the first insulating film has been formed, and etching the fourth nitride semiconductor layer with the mask film as a mask.

17. The method according to claim 16, wherein the second insulating film is a nitride film.

18. The method according to claim 11, wherein the mesa part includes the fourth nitride semiconductor layer being undoped.

19. The method according to claim 11, further comprising, between the step (d) and the step (e), the step of:
   (f) forming the gate insulating film over the mesa part, wherein the gate electrode is formed over the gate insulating film.

* * * * *